(12) United States Patent
Chou et al.

(10) Patent No.: US 9,564,468 B2
(45) Date of Patent: Feb. 7, 2017

(54) COMPOSITE GRID STRUCTURE TO REDUCE CROSSTALK IN BACK SIDE ILLUMINATION IMAGE SENSORS

(71) Applicant: Taiwan Semiconductor Manufacturing Co., Ltd., Hsin-Chu (TW)

(72) Inventors: Keng-Yu Chou, Kaohsiung (TW); Chun-Hao Chuang, Hsinchu (TW); Chien-Hsien Tseng, Hsinchu (TW); Shyh-Fann Ting, Tainan (TW); Wei-Chieh Chiang, Yuanlin Township (TW); Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/663,899

(22) Filed: Mar. 20, 2015

(65) Prior Publication Data

US 2016/0276394 A1 Sep. 22, 2016

(51) Int. Cl.
*H01L 27/146* (2006.01)

(52) U.S. Cl.
CPC ..... *H01L 27/14645* (2013.01); *H01L 27/1463* (2013.01); *H01L 27/1464* (2013.01); *H01L 27/14621* (2013.01); *H01L 27/14625* (2013.01); *H01L 27/14627* (2013.01); *H01L 27/14685* (2013.01)

(58) Field of Classification Search
CPC ............. H01L 27/146; H01L 27/14643; H01L 27/14645; H01L 27/14621; H01L 27/14625

See application file for complete search history.

(56) References Cited

U.S. PATENT DOCUMENTS

| 2011/0222006 | A1* | 9/2011 | Imanishi | G02F 1/1337 349/124 |
| 2012/0273906 | A1* | 11/2012 | Mackey | H01L 27/14605 257/432 |
| 2014/0061839 | A1 | 3/2014 | Ting et al. | |

(Continued)

OTHER PUBLICATIONS

U.S. Appl. No. 14/100,598, filed with the USPTO on Dec. 9, 2013.

*Primary Examiner* — Phuc Dang
(74) *Attorney, Agent, or Firm* — Eschweiler & Associates, LLC

(57) ABSTRACT

A semiconductor structure for back side illumination (BSI) pixel sensors is provided. Photodiodes are arranged within a semiconductor substrate. A metal grid overlies the semiconductor substrate and is made up of metal grid segments that surround outer perimeters of the photodiodes, respectively, such that first openings within the metal grid overlie the photodiodes, respectively. A low-n grid is made up of low-n grid segments that surround the respective outer perimeters of the photodiodes, respectively, such that second openings within the low-n grid overlie the photodiodes, respectively. Color filters are arranged in the first and second openings of the photodiodes and have a refractive index greater than a refractive index of the low-n grid. A substrate isolation grid extends into the semiconductor substrate and is made up of isolation grid segments that surround outer perimeters of the photodiodes, respectively. A method for manufacturing the BSI pixel sensors is also provided.

20 Claims, 20 Drawing Sheets

(56) References Cited

U.S. PATENT DOCUMENTS

| | | | |
|---|---|---|---|
| 2014/0263956 A1* | 9/2014 | Jian | H01L 27/1463 250/208.1 |
| 2014/0299957 A1* | 10/2014 | Hu | H01L 27/1463 257/443 |
| 2015/0048467 A1* | 2/2015 | Weng | H01L 31/0232 257/432 |
| 2016/0013231 A1* | 1/2016 | Lee | H01L 27/1463 257/432 |

* cited by examiner

COMPOSITE GRID STRUCTURE TO REDUCE CROSSTALK IN BACK SIDE ILLUMINATION IMAGE SENSORS

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
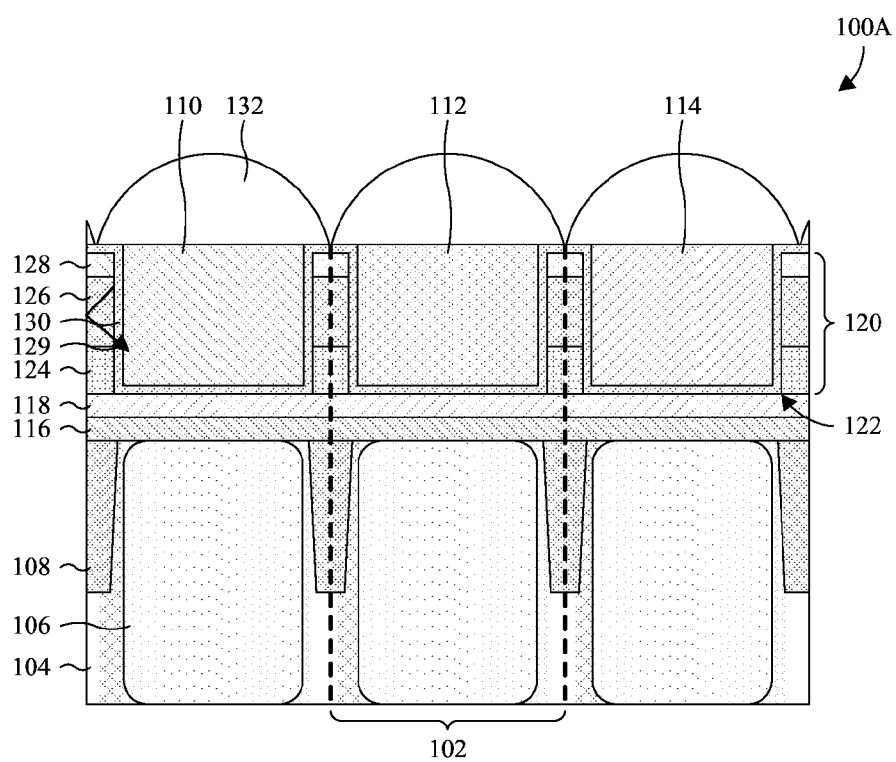
FIG. 1A illustrates a cross-sectional view of some embodiments of a semiconductor structure for aligned back side illumination (BSI) pixel sensors.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Back side illumination (BSI) image sensors include an array of pixel sensors. Some semiconductor structures for the BSI image sensors include an integrated circuit having a semiconductor substrate and photodiodes corresponding to the pixel sensors arranged within the substrate. A back-end-of-line (BEOL) metallization stack of the integrated circuit underlies the semiconductor substrate along a first, front side of the semiconductor substrate. Color filters and micro lenses of the semiconductor structure correspond to the pixel sensors and are stacked in that order over the photodiodes of the corresponding pixel sensors on a second, back side of the semiconductor substrate. Further, a grid of the semiconductor structure is arranged on the second, back side of the semiconductor substrate between the color filters.

A challenge with BSI image sensors is cross talk between neighboring pixel sensors. As BSI image sensors become smaller and smaller, the distance between neighboring pixel sensors becomes smaller and smaller, thereby increasing the likelihood of cross talk. Cross talk reduces quantum efficiency, angular response, and SNR10 under oblique incident light. Further, BSI image sensors typically do not have optical isolation near an upper surface of the semiconductor substrate, along the back side of the semiconductor substrate. Cross talk near the upper surface of the semiconductor substrate tends to be greater than above or below the upper surface. Another challenge with BSI image sensors is light collection. As BSI image sensors become smaller and smaller, the surface area for light collection becomes smaller and smaller, thereby reducing the sensitivity of pixel sensors. This is problematic for low light environments.

In view of the foregoing, the present application is directed to a semiconductor structure of a BSI image sensor with improved optical isolation and light collection. The semiconductor structure includes a semiconductor substrate and photodiodes arranged in the substrate. Further, the semiconductor structure includes a composite grid and color filters corresponding to the photodiodes. The color filters are arranged over the corresponding photodiodes, and the composite grid is arranged around and between the color filters. The composite grid includes a metal grid and a low refractive index (low-n) grid overlying the metal grid. The low-n grid has a refractive index less than a refractive index of the color filters. Due to the low refractive index, the low-n grid isolates neighboring color filters and directs light to the color filters to increase the effective size of the color filters. The metal grid blocks light, thereby isolating neighboring color filters. Even more, the semiconductor structure includes a substrate isolation grid. In some embodiments, the substrate isolation grid is or otherwise includes the metal grid. In such embodiments, the metal grid extends into the semiconductor substrate between the photodiodes. In other embodiments, the substrate isolation grid includes a deep trench isolation (DTI) region. The DTI region is arranged in the semiconductor substrate around and between the photodiodes.

Advantageously, the DTI region and the extended metal grid improve optical isolation between neighboring pixel sensors, and thereby reduce cross talk in the semiconductor substrate. This improves quantum efficiency, angular response, and SNR10 under oblique incident light. Further, the extended metal grid improves optical isolation near an upper surface of the semiconductor substrate, and above and below the semiconductor substrate. Optical isolation near the upper surface of the semiconductor substrate is known to be more important than optical isolation above and below the upper surface.

With reference to FIG. 1A, a cross-sectional view 100A of some embodiments of a semiconductor structure for aligned BSI pixel sensors 102 is provided. The pixel sensors 102 are typically arranged within a pixel sensor array of a BSI image sensor, and are typically arranged at a center of the pixel sensor array. The semiconductor structure includes a semiconductor substrate 104 within which photodiodes 106 corresponding to the pixel sensors 102 are arranged. The photodiodes 106 are arranged in rows and/or columns within the semiconductor substrate 104, and configured to accumulate charge (e.g., electrons) from photons incident on the photodiodes 106. The semiconductor substrate 104 may be, for example, a bulk semiconductor substrate, such as a bulk silicon substrate, or a silicon-on-insulator (SOI) substrate.

A DTI region 108 defines a substrate isolation grid, made up of grid segments, such as individual rectangles or squares which abut one another. Further, the DTI region 108 extends into the semiconductor substrate 104 from about even with an upper surface of the substrate 104. The DTI region 108 is laterally arranged around and between the photodiodes 106 to advantageously provide optical isolation between neighboring photodiodes 106. The DTI region 108 may be, for example, a metal, such as tungsten, copper, or aluminum copper. Alternatively, the DTI region 108 may be, for example, a low-n material. A low-n material has a refractive index less than color filters 110, 112, 114 overlying corresponding ones of the pixel sensors 102. In some embodiments, the DTI region 108 has a refractive index less than about 1.6. Further, in some embodiments, the DTI region 108 is a dielectric, such as an oxide (e.g., $SiO_2$) or hafnium oxide (e.g., $HfO_2$), or a material with a refractive index less than silicon.

An antireflective coating (ARC) 116, and/or a first dielectric layer 118, of the semiconductor structure are arranged over the semiconductor substrate 104 along an upper surface of the semiconductor substrate 104. In embodiments where both the ARC 116 and the first dielectric layer 118 are present, the first dielectric layer 118 is typically arranged over the ARC 116. The ARC 116 and/or the first dielectric layer 118 space the semiconductor substrate 104 from a composite grid 120 of the semiconductor structure that overlies the substrate 104. The first dielectric layer 118 may be, for example, an oxide, such as silicon dioxide.

The composite grid 120 is laterally arranged around and between the photodiodes 106 to define openings 122 within which the color filters 110, 112, 114 are arranged. The openings 122 correspond to the pixel sensors 102 and are centrally aligned with the photodiodes 106 of the corresponding pixel sensors 102. The composite grid 120 includes one or more of a metal grid 124, a low-n grid 126, and a hard mask grid 128 stacked in that order over the semiconductor substrate 104. Each grid 124, 126, 128 is made up of grid segments, such as individual rectangles or squares which abut one another to collectively make up the grid 124, 126, 128 and which surround respective photodiodes 106. Each grid 124, 126, 128 also includes openings 122 between the grid segments and which overlie the photodiodes 106. The metal grid 124 blocks light from passing between neighboring pixel sensors 102 to help reduce cross talk. The metal grid 124 may be, for example, tungsten, copper, or aluminum copper. The low-n grid 126 is a transparent material with a refractive index less than a refractive index of the color filters 110, 112, 114. Due to the low refractive index, the low-n grid 126 serves as a light guide to direct light 129 to the color filters 110, 112, 114 and to effectively increase the size of the color filters 110, 112, 114. Further, due to the low refractive index, the low-n grid 126 serves to provide optical isolation between neighboring pixel sensors 102. Light within the color filters 110, 112, 114 that strikes the boundary with the low-n grid 126 typically undergoes total internal reflection due to the refractive indexes. In some embodiments, the low-n grid 126 is a dielectric, such as an oxide (e.g., $SiO_2$) or hafnium oxide (e.g., $HfO_2$), or a material with a refractive index less than silicon. The hard mask grid 128 may be, for example, silicon nitride or silicon oxynitride.

The color filters 110, 112, 114 are arranged over the ARC 116 and/or the first dielectric layer 118. Further, the color filters 110, 112, 114 are arranged over the photodiodes 106 of corresponding pixel sensors 102 within the openings 122 of the composite grid 120. The color filters 110, 112, 114 have upper surfaces that are approximately even with an upper surface of the composite grid 120. Further, the color filters 110, 112, 114 are assigned corresponding colors or wavelengths of light, and configured to filter out all but the assigned colors or wavelengths of light. Typically, the color filter assignments alternate between red, green, and blue light, such that the color filters 110, 112, 114 include red color filters 110, green color filters 112, and blue color filters 114. In some embodiments, the color filter assignments alternative between red, green, and blue light according to a Bayer filter mosaic.

A second dielectric layer 130 lining the composite grid 120 spaces the color filters 110, 112, 114 from the composite grid 120, and micro lenses 132 corresponding to the pixel sensors 102 cover the color filters 110, 112, 114. The second dielectric layer 130 may be, for example, an oxide, such as silicon dioxide, and may be the same material or a different material than the low-n grid 126. The micro lenses 132 are centered with the photodiodes 106 of the corresponding pixel sensors 102, and are typically symmetrical about vertical axes centered on the photodiodes 106. Further, the micro lenses 132 typically overhang the composite grid 120 around the openings 122 so neighboring edges of the micro lenses 132 abut.

Figure 1B:
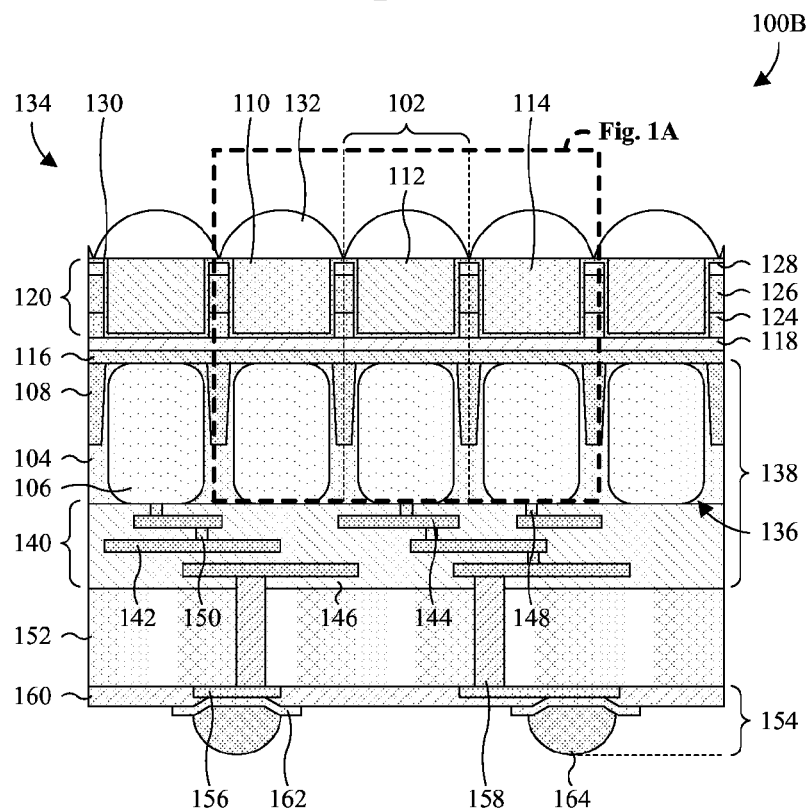
FIG. 1B illustrates a cross-sectional view of some embodiments of a semiconductor structure for a BSI image sensor package including the pixel sensors of FIG. 1A.

With reference to FIG. 1B, a cross-sectional view 100B of some embodiments of a semiconductor structure for a BSI image sensor package 134 is provided. The BSI image sensor package 134 includes an array 136 of pixel sensors 102 arranged in rows and column on a first, back side of an integrated circuit 138. In some embodiments, the pixel sensor array 136 includes the pixel sensors 102 of FIG. 1A, typically arranged at a center of the pixel sensor array 136. Further, in some embodiments, the pixel sensor array 136 includes millions of pixel sensors, and/or hundreds, if not thousands, of rows and columns. For example, the pixel sensor array 136 may include about 3 million pixel sensors arranged in 1536 rows and 2048 columns.

The integrated circuit 138 includes a semiconductor substrate 104 and a device region (partially shown). The device region is arranged along a lower surface of the semiconductor substrate 104, and extends into the semiconductor substrate 104. The device region includes photodiodes 106 corresponding to the pixel sensors 102 and logic devices, such as transistors, for readout of the photodiodes 106. The photodiodes 106 are arranged in rows and columns within the semiconductor substrate 104, and configured to accumulate charge from photons incident on the photodiodes 106. Further, the photodiodes 106 are optically isolated from each other by a DTI region 108 in the semiconductor substrate 104, thereby reducing cross talk.

A BEOL metallization stack 140 of the integrated circuit 138 underlies the semiconductor substrate 104 and includes a plurality of metallization layers 142, 144 stacked within an interlayer dielectric (ILD) layer 146. One or more contacts 148 of the BEOL metallization stack 140 extend from a metallization layer 144 to the device region. Further, one or more first vias 150 of the BEOL metallization stack 140 extend between the metallization layers 142, 144 to interconnect the metallization layers 142, 144. The ILD layer 146 may be, for example, a low κ dielectric (i.e., a dielectric with a dielectric constant less than about 3.9) or an oxide. The metallization layers 142, 144, the contacts 148, and the first vias 150 may be, for example, a metal, such as copper or aluminum.

A carrier substrate 152 underlies the integrated circuit 138 between the integrated circuit 138 and a ball grid array (BGA) 154. The BGA 154 includes a redistribution layer (RDL) 156 arranged along a lower surface of the carrier substrate 152 and electrically coupled to the metallization layers 142, 144 of the BEOL metallization stack 140 through one or more second, through silicon vias 158 extending through the carrier substrate 152. The RDL 156 is covered by a BGA dielectric layer 160, and under bump metallization (UBM) layers 162 extend through the BGA dielectric layer 160 to electrically couple solder balls 164 underlying the UBM layers 162 to the RDL 156. The BGA dielectric layer 160 may be, for example, an epoxy. The RDL 156, the UBM layers 162, the second vias 158, and the solder balls 164 may be, for example, metals, such as copper, aluminum, and tungsten.

Figure 2:
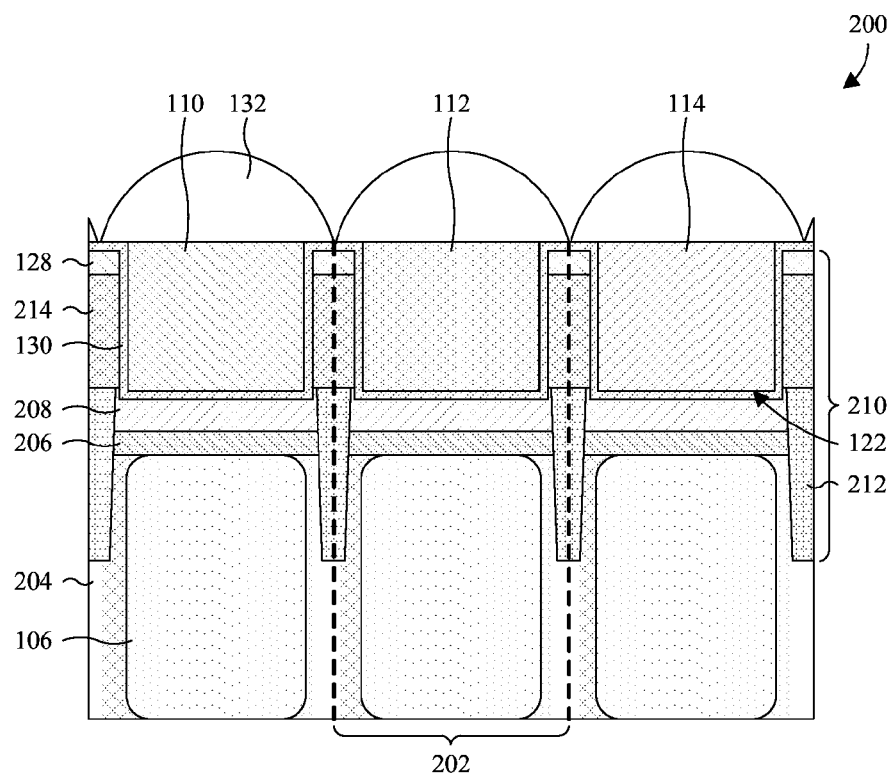
FIG. 2 illustrates a cross-sectional view of other embodiments of a semiconductor structure for aligned BSI pixel sensors.

With reference to FIG. 2, a cross-sectional view 200 of other embodiments of a semiconductor structure for aligned BSI pixel sensors 202 is provided. The semiconductor structure includes a semiconductor substrate 204 within which photodiodes 106 corresponding to the pixel sensors 102 are arranged. Further, an ARC 206, and/or a first dielectric layer 208, of the semiconductor structure are arranged over the semiconductor substrate 204. The first dielectric layer 208 may be, for example, an oxide, such as silicon dioxide. The ARC 206, and/or the first dielectric layer 208, space the semiconductor substrate 204 from a composite grid 210 of the semiconductor structure.

The composite grid 210 is laterally arranged around and between the photodiodes 106 to define openings 122 within which color filters 110, 112, 114 are arranged. The openings 122 correspond to the pixel sensors 202 and are centrally aligned with the photodiodes 106 of the corresponding pixel sensors 202. Further, in some embodiments, the openings 122 extend into the first dielectric layer 208. The composite grid 210 includes a metal grid 212, a low-n grid 214, and a hard mask grid 128 stacked in that order, with an upper surface approximately even with upper surfaces of the color filters 110, 112, 114. The metal grid 212 extends from about even with an upper surface of the ARC 206 and/or the first dielectric layer 208, through the ARC 206 and/or the first dielectric layer 208, into the semiconductor substrate 204 between and around the photodiodes 106. The metal grid 212 advantageously blocks light from passing between neighboring pixel sensors 202 near an upper surface of the semiconductor substrate 106, as well as above and below the upper surface, to help reduce cross talk. Therefore, the metal grid 212 defines a substrate isolation grid or otherwise forms part of a substrate isolation grid. The metal grid 212 may be, for example, tungsten, copper, or aluminum copper. The low-n grid 214 is a transparent, low-n material with a refractive index less than a refractive index of the color filters 110, 112, 114.

Figure 3:
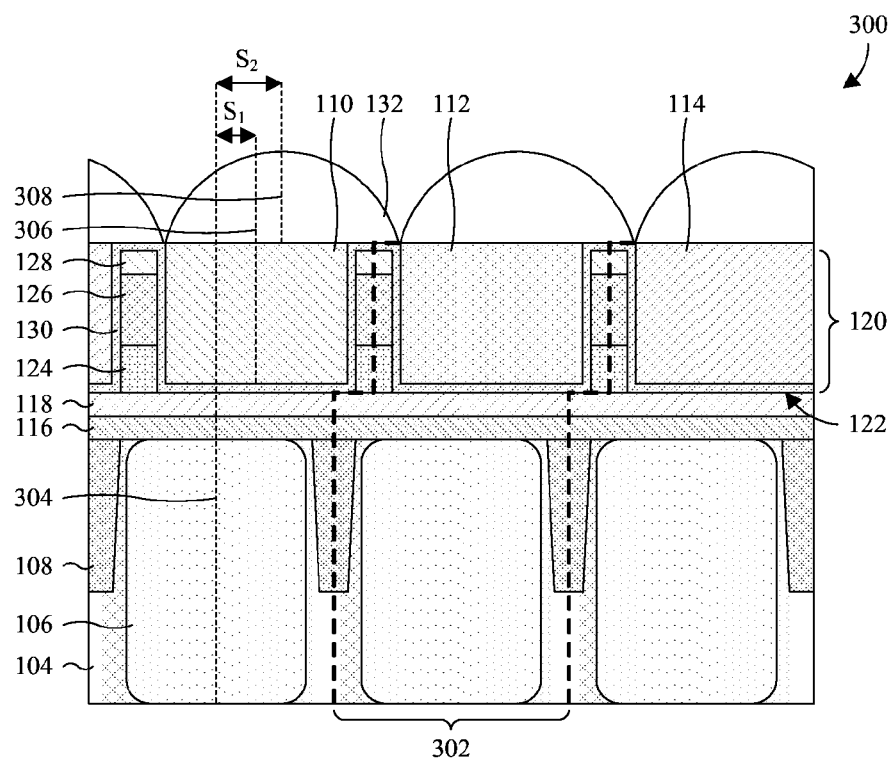
FIG. 3 illustrates a cross-sectional view of first embodiments of a semiconductor structure for shifted BSI pixel sensors.

With reference to FIG. 3, a cross-sectional view 300 of first embodiments of a semiconductor structure for shifted BSI pixel sensors 302 is provided. The pixel sensors 302 are typically arranged within a pixel sensor array of a BSI image sensor. Further, the pixel sensors are typically arranged at an edge of the pixel sensor array or otherwise offset from the center of the pixel sensor array. For example, the pixel sensors 302 may be arranged at an edge of the pixel sensor array 136 of FIG. 1B. The pixel sensors 302 include corresponding color filters 110, 112, 114 and corresponding micro lenses 132. The color filters 110, 112, 114 are arranged over photodiodes 106 of the corresponding pixel sensors 302 in openings 122 of a composite grid 120. The micro lenses 132 are arranged over the color filters 110, 112, 114, and the photodiodes 106, of the corresponding pixel sensors 302. Further, the micro lenses 132 overhang the composite grid 112 in at least one direction.

The color filters 110, 112, 114 and the composite grid 120 are laterally shifted or offset from the photodiodes 106 of the corresponding pixel sensors 302 in the at least one direction by an amount $S_1$, and the micro lenses 132 are laterally shifted or offset from the photodiodes 302 of the corresponding pixel sensors 302 in the at least one direction by an amount $S_2$. Typically, the shift amount $S_2$ is greater than the shift amount $S_1$. The shift amounts $S_1, S_2$ may be, for example, between center axes 304, 306, 308 of the photodiodes 106, the micro lenses 132, and the color filters 110, 112, 114. Further, the shift amounts $S_1$ and $S_2$ may be, for example, proportional to distance from a center of a pixel sensor array to improve pixel efficiency where the chief ray angle of incoming light is not normal or perpendicular. Thus, the shift amounts $S_1$ and $S_2$ may vary over the pixel sensor array with the center of the pixel sensor array having shift amounts $S_1$ and $S_2$ of zero (or near zero) and edges of the pixel sensor array having greatest shift amounts $S_1$ and $S_2$.

Figure 4:
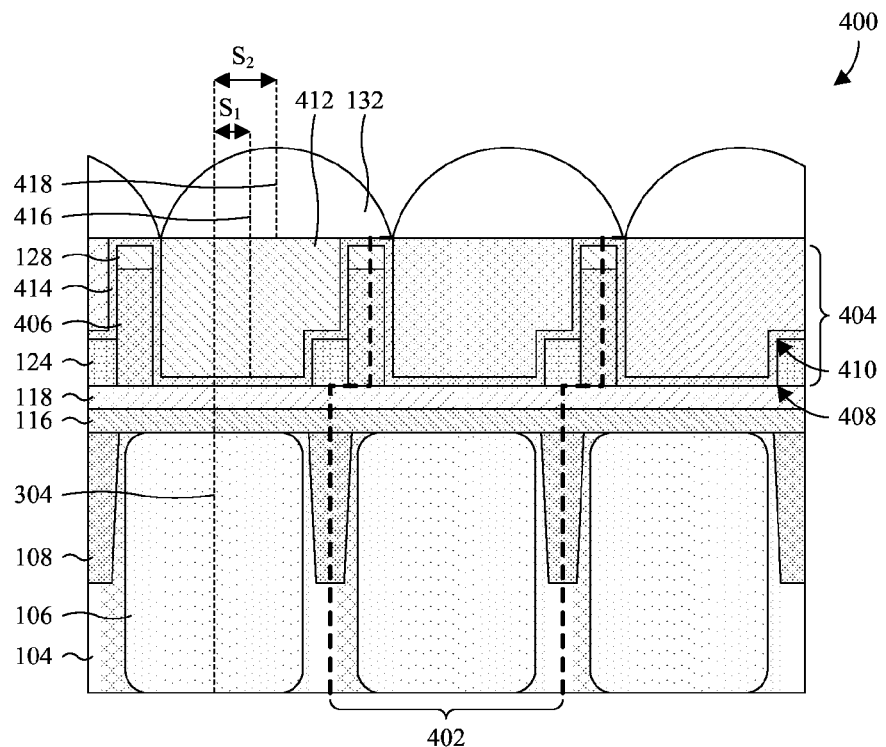
FIG. 4 illustrates a cross-sectional view of second embodiments of a semiconductor structure for shifted BSI pixel sensors.

With reference to FIG. 4, a cross-sectional view 400 of second embodiments of a semiconductor structure for shifted BSI pixel sensors 402 is provided. The BSI pixel sensors 402 are typically arranged within a pixel sensor array of a BSI image sensor, and typically arranged at an edge of the pixel sensor array or otherwise offset from the center of the pixel sensor array. A composite grid 404 includes a metal grid 124, a low-n grid 406, and a hard mask grid 128. The metal grid 124 is laterally arranged around and between photodiodes 106 corresponding to the pixel sensors 402 to define first openings 408 corresponding to the pixel sensors 402. The first openings 408 are centered with the photodiodes 106 of the corresponding pixel sensors 402 over the photodiodes 106. The low-n grid 406 shares a layout with the metal grid 122, and is laterally shifted or offset in at least one direction from the metal grid 122 so the low-n grid 406 neighbors the metal grid 124 with sidewalls of the low-n and metal grids 124, 406 abutting. The hard mask grid 128 overlies the low-n grid 406, and the low-n grid 406 and the hard mask grid 128 define second openings 410 corresponding to the pixel sensors 402. The second openings 410 overlap with the first openings 408 of the corresponding pixel sensors 402, and partially overly the photodiodes 106 of the corresponding pixel sensors 402.

Color filters 412 corresponding to the pixel sensors 402 are arranged over the photodiodes 106 of the corresponding pixel sensors 402 within the first and second openings 408, 410 of the corresponding pixel sensors 402. The color filters 412 are spaced from the composite grid 404 by a second dielectric layer 414 lining the composite grid 404, and have upper surfaces approximately even with an upper surface of the composite grid 404. Due to the shift or offset in the low-n grid 406, the color filters 412 are laterally shifted or offset from the photodiodes 106 of the corresponding pixel sensors 402 in the at least one direction by an amount $S_1$ and have a stepped profile. Micro lenses 132 corresponding to the pixel sensors 402 are arranged over the color filters 412, and laterally shifted or offset from the photodiodes 106 of the corresponding pixel sensors 402 in the at least one direction by an amount $S_2$. The shift amounts $S_1, S_2$ may be, for example, between center axes 304, 416, 418 of the photodiodes 106, the micro lenses 132, and the color filters 412.

Figure 5:
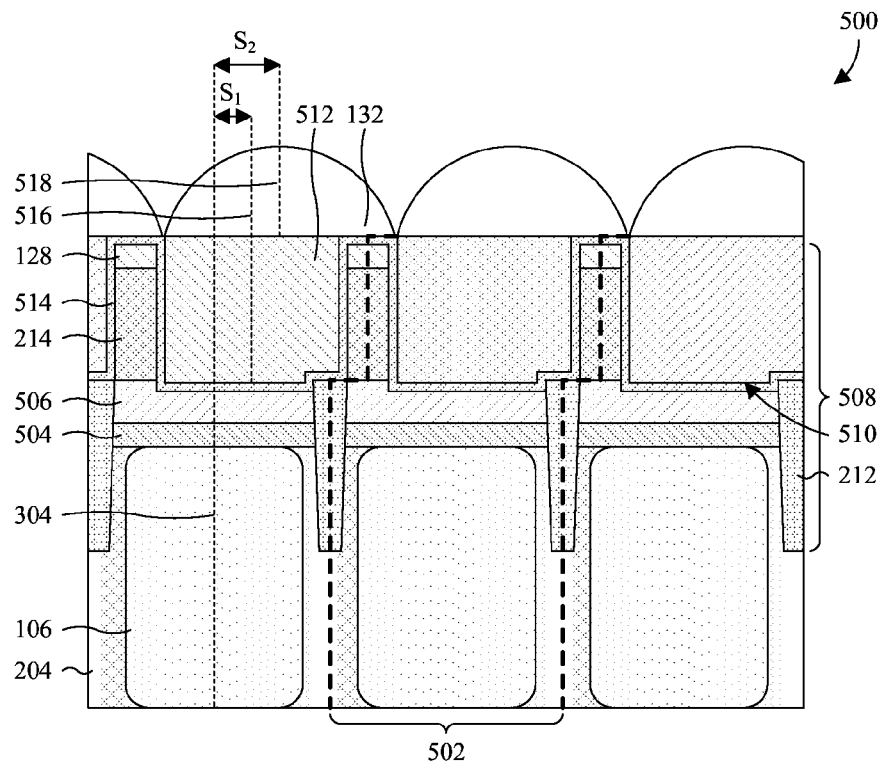
FIG. 5 illustrates a cross-sectional view of other second embodiments of a semiconductor structure for shifted BSI pixel sensors.

With reference to FIG. 5, a cross-sectional view 500 of other second embodiments of a semiconductor structure for shifted BSI pixel sensors 502 is provided. An ARC 504, and/or a first dielectric layer 506, of the semiconductor structure are arranged over a semiconductor substrate 204, within which photodiodes 106 corresponding to the pixel sensors 502 are arranged. The first dielectric layer 506 may be, for example, an oxide, such as silicon dioxide. The ARC 504, and/or a first dielectric layer 506, space the semiconductor substrate 204 from a composite grid 508 of the semiconductor structure.

The composite grid 508 is laterally arranged around and between the photodiodes 106, and includes a metal grid 212, a low-n grid 214, and a hard mask grid 128. The metal grid 212 is laterally arranged around and between photodiodes 106 corresponding to the pixel sensors 402, and extends into the semiconductor substrate 204. The low-n grid 214 shares a layout with the metal grid 212, and is arranged above the metal grid 212. Further, the low-n grid 214 is laterally shifted or offset in at least one direction from the metal grid 124. In some embodiments, the low-n grid 214 is shifted or offset so edges of the low-n grid 214 and the metal grid 212 abut or are otherwise aligned. The hard mask grid 128 overlies the low-n grid 214, and the low-n grid 214 and the hard mask grid 128 define openings 510 corresponding to the pixel sensors 502. The openings 510 partially overly the photodiodes 106 of the corresponding pixel sensors 502 and, in some embodiments, extend into the first dielectric layer 506.

Color filters 512 corresponding to the pixel sensors 502 are arranged over the photodiodes 106 of the corresponding pixel sensors 502 within the openings 510 of the corresponding pixel sensors 502. The color filters 512 are spaced from the composite grid 508 by a second dielectric layer 514 lining the composite grid 508, and have upper surfaces approximately even with an upper surface of the composite grid 508. Due to the shift or offset in the low-n grid 214, the color filters 512 are laterally shifted or offset from the photodiodes 106 of the corresponding pixel sensors 502 in the at least one direction by an amount $S_1$. Micro lenses 132 corresponding to the pixel sensors 502 are arranged over the color filters 510, and laterally shifted or offset from the photodiodes 106 of the corresponding pixel sensors 502 in the at least one direction by an amount $S_2$. The shift amounts $S_1, S_2$ may be, for example, between center axes 304, 516, 518 of the photodiodes 106, the micro lenses 132, and the color filters 412.

Figure 6:
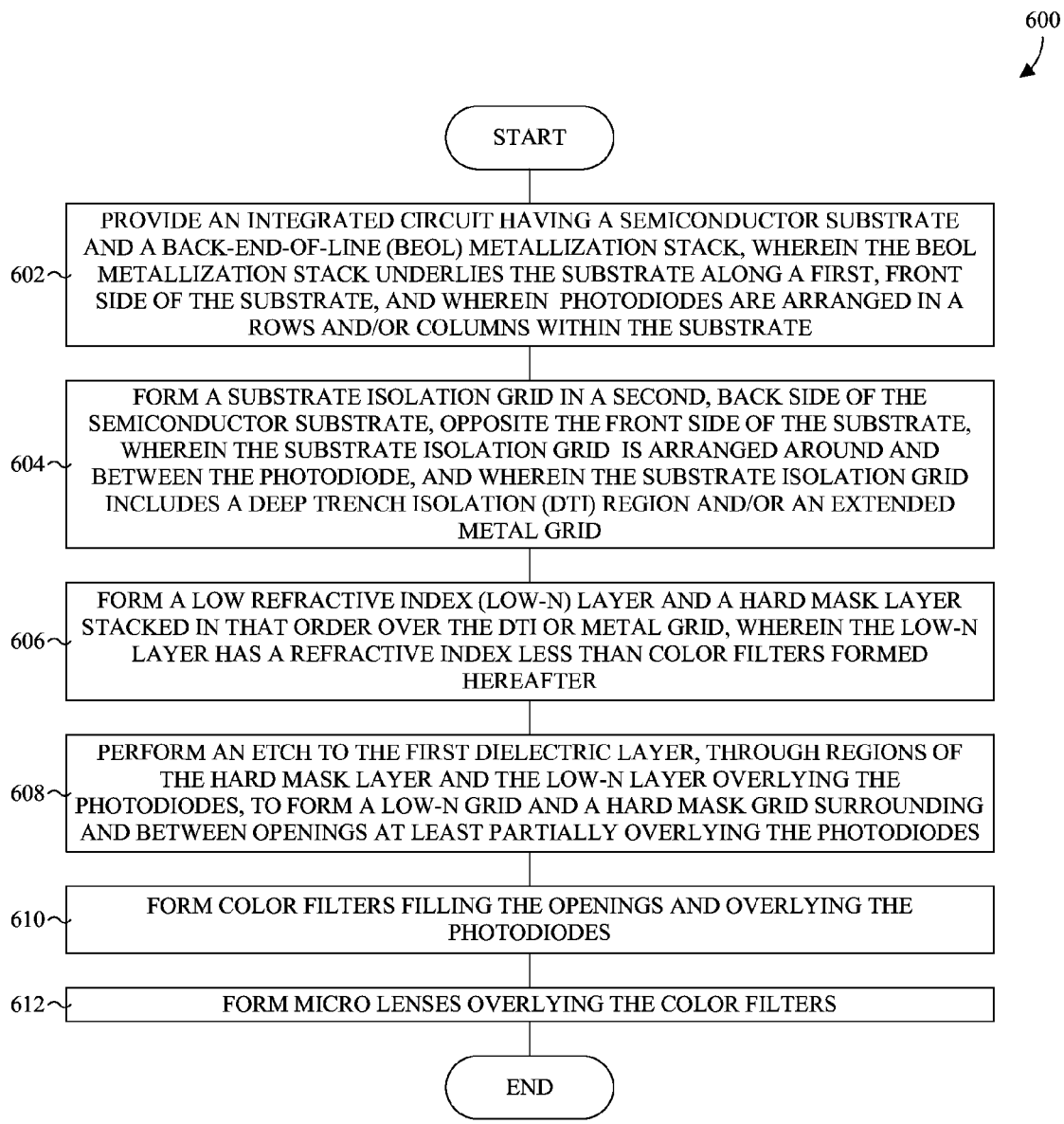
FIG. 6 illustrates a flowchart of some embodiments of a method for manufacturing a semiconductor structure for BSI pixel sensors.

With reference to FIG. 6, a flowchart 600 of some embodiments of a method for manufacturing a semiconductor structure for BSI pixel sensors.

At 602, an integrated circuit having a semiconductor substrate and a BEOL metallization stack is provided. The BEOL metallization stack underlies the semiconductor substrate along a first, front side of the substrate, and photodiodes are arranged in a rows and/or columns within the substrate.

At 604, a substrate isolation grid is formed on a second, back side of the semiconductor substrate, opposite the front side of the substrate. In some embodiments, the substrate isolation grid is a DTI region. Alternatively, in other embodiments, the substrate isolation grid is or otherwise includes a metal grid overlying and extending into the back side of the substrate. The substrate isolation grid is arranged around and between the photodiodes. Advantageously, the substrate isolation grid provides optical isolation between neighboring pixel sensors, which reduces cross talk. Further, wherein the substrate isolation grid is or otherwise includes the metal grid, the substrate isolation grid provides optical isolation near a surface of the semiconductor substrate along the back side of the substrate. Optical isolation near the surface is known to have a greater impact on cross talk than optical isolation above or below the surface.

At 606, a low-n layer and a hard mask layer are formed stacked in that order over the DTI or metal grid and the integrated circuit. The low-n grid has a refractive index less than color filters formed hereafter.

At 608, an etch to the first dielectric layer is performed, through regions of the hard mask layer and the low-n layer overlying the photodiodes. The etch forms a low-n grid and a hard mask grid surrounding and between openings at least partially overlying the photodiodes. Advantageously, the low-n grid has a refractive index less than color filters formed hereafter, and therefore serves as a light guide to increase light collection. Further, the low-n grid provides optical isolation and reduces cross talk between neighboring pixel sensors.

At 610, color filters filling the openings and overlying the photodiodes are formed.

At 612, micro lenses overlying the color filters are formed.

While the method described by the flowchart 600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 7A:
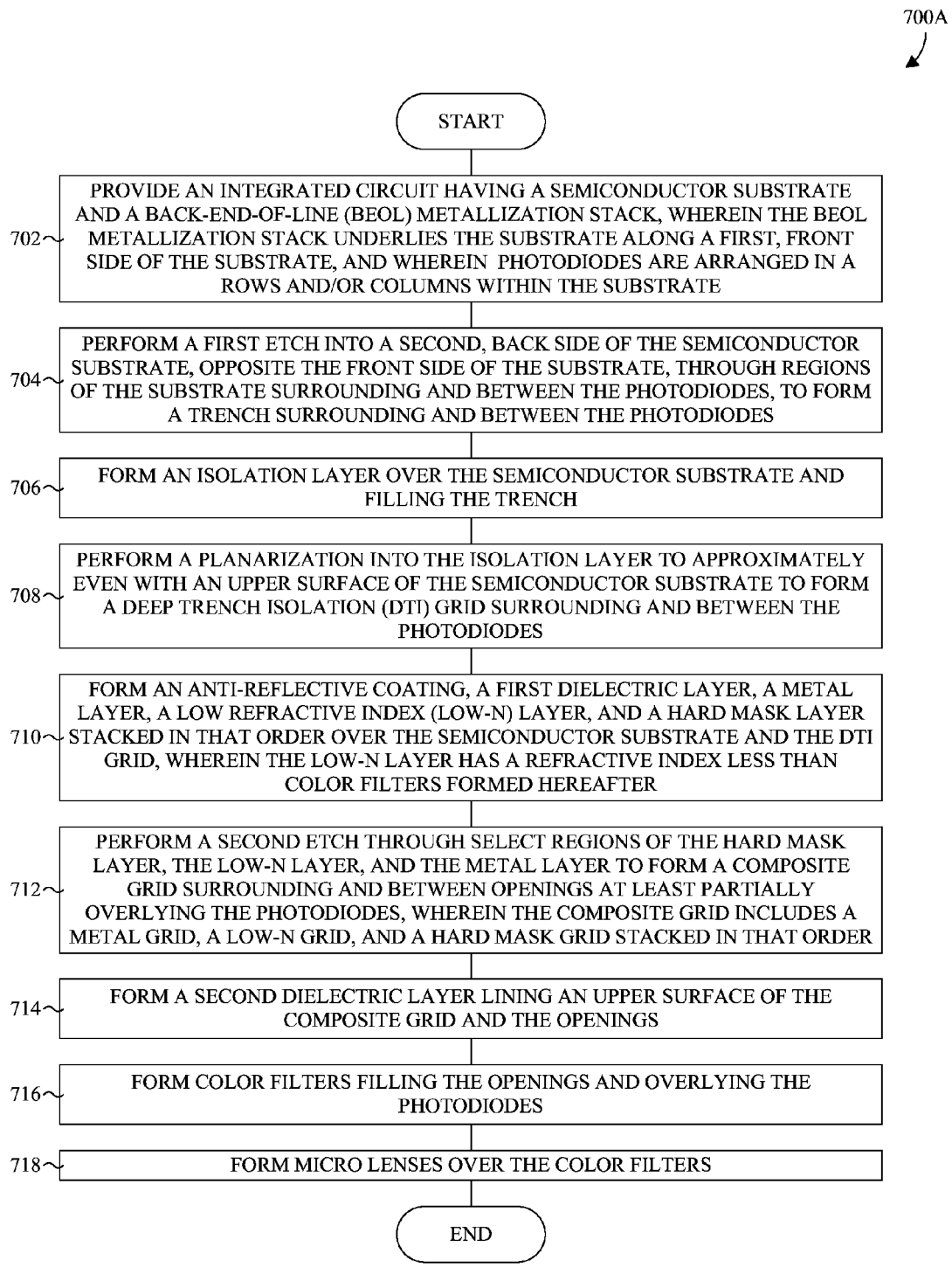
FIG. 7A illustrates a flowchart of more detailed embodiments of the method of FIG. 6 in which a semiconductor structure for aligned BSI pixel sensors is manufactured.

With reference to FIG. 7A, a flowchart 700A of more detailed embodiments of the method of FIG. 6 is provided. As seen hereafter, the more detailed embodiments are directed to aligned BSI pixel sensors with a DTI region.

At 702, an integrated circuit having a semiconductor substrate and a BEOL metallization stack is provided. The BEOL metallization stack underlies the semiconductor substrate along a first, front side of the substrate, and photodiodes are arranged in a rows and/or columns within the substrate.

At 704, a first etch is performed into a second, back side of the semiconductor substrate, opposite the front side of the substrate, through regions of the substrate surrounding and between the photodiodes. The first etch forms a trench surrounding and between the photodiodes.

At 706, an isolation layer is formed over the semiconductor substrate and filling the trench.

At 708, a planarization is performed into the isolation layer to approximately even with an upper surface of the semiconductor substrate to form a DTI region surrounding and between the photodiodes.

At 710, an ARC, a first dielectric layer, a metal layer, a low-n layer, and a hard mask layer are formed stacked in that order over the semiconductor substrate and the DTI region. The low-n layer has a refractive index less than color filters formed hereafter.

At 712, a second etch is performed through select regions of the hard mask layer, the low-n layer, and the metal layer to form a composite grid surrounding and between openings at least partially overlying the photodiodes. The composite grid includes a metal grid, a low-n grid, and a hard mask grid stacked in that order.

At 714, a second dielectric layer is formed lining an upper surface of the composite grid and the openings.

At 716, color filters are formed filling the openings and overlying the photodiodes.

At 718, micro lenses are formed over the color filters.

While the method described by the flowchart 700A is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 7B:
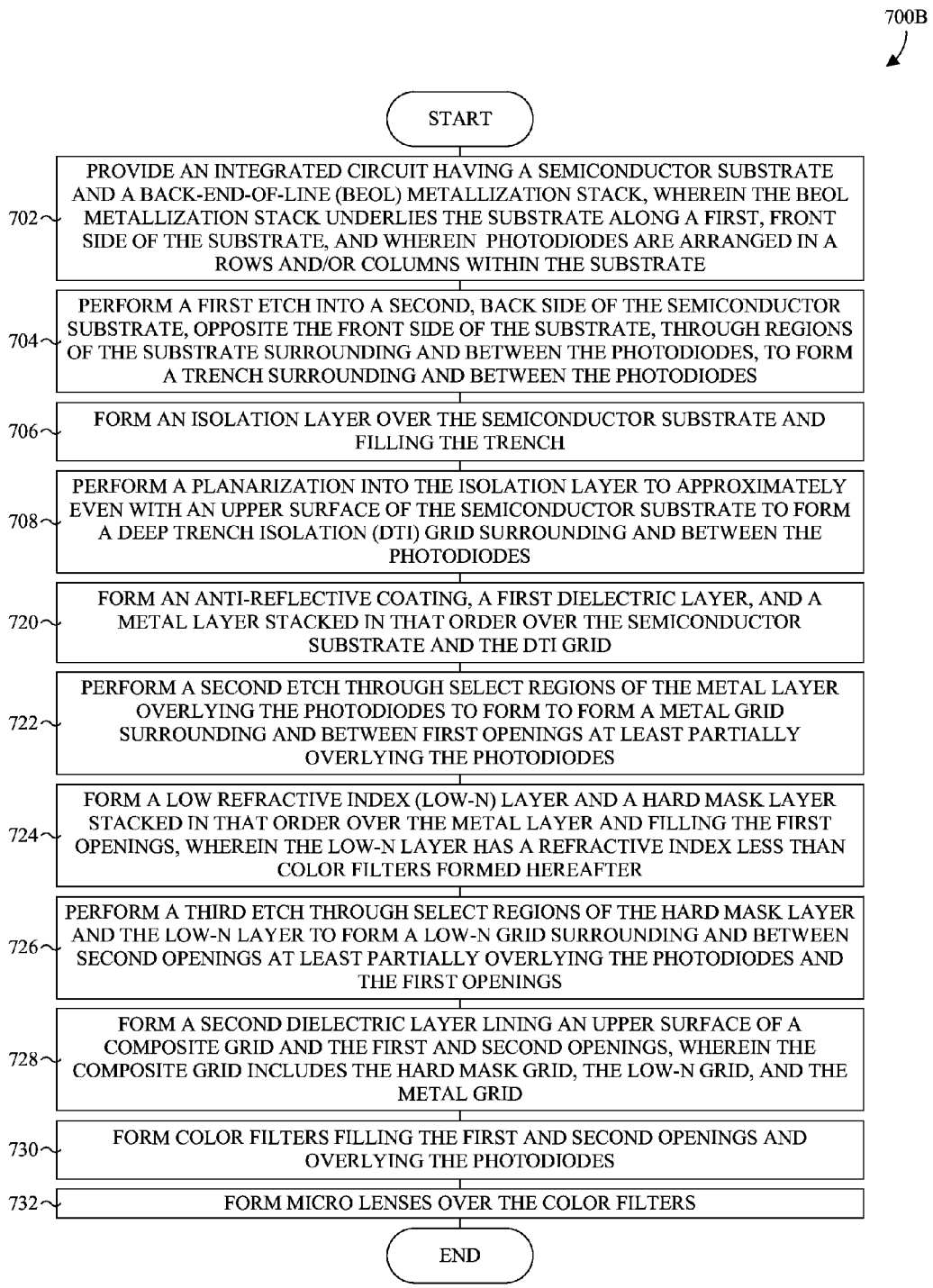
FIG. 7B illustrates a flowchart of more detailed embodiments of the method of FIG. 6 in which a semiconductor structure for shifted BSI pixel sensors is manufactured.

With reference to FIG. 7B, a flowchart 700B of more detailed embodiments of the method of FIG. 6 is provided. As seen hereafter, the more detailed embodiments are directed to shifted BSI pixel sensors with a DTI region.

At 702, an integrated circuit having a semiconductor substrate and a BEOL metallization stack is provided. The BEOL metallization stack underlies the semiconductor substrate along a first, front side of the substrate, and photodiodes are arranged in a rows and/or columns within the substrate.

At 704, a first etch is performed into a second, back side of the semiconductor substrate, opposite the front side of the substrate, through regions of the substrate surrounding and between the photodiodes. The first etch forms a trench surrounding and between the photodiodes.

At 706, an isolation layer is formed over the semiconductor substrate and filling the trench.

At 708, a planarization is performed into the isolation layer to approximately even with an upper surface of the semiconductor substrate to form a DTI region surrounding and between the photodiodes. The DTI region defines a substrate isolation grid.

At 720, an ARC, a first dielectric layer, and a metal layer are formed stacked in that order over the semiconductor substrate and the DTI region.

At 722, a second etch is performed through select regions of the metal layer overlying the photodiodes to form to form a metal grid around and between first openings at least partially overlying the photodiodes.

At 724, a low-n layer and a hard mask layer are formed stacked in that order over the metal layer and filling the first openings. The low-n layer has a refractive index less than color filters formed hereafter.

At 726, a third etch is performed through select regions of the hard mask layer and the low-n layer to form a low-n grid and a hard mask surrounding and between second openings at least partially overlying the photodiodes and the first openings.

At 728, a second dielectric layer is formed lining an upper surface of a composite grid and the first and second openings. The composite grid includes the hard mask grid, the low-n grid, and the metal grid.

At 730, color filters are formed filling the first and second openings and overlying the photodiodes.

At 732, micro lenses are formed over the color filters.

While the method described by the flowchart 700B is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 8-11, 12A-E, and 13A-G, cross-sectional views of some embodiments of a semiconductor structure for BSI pixel sensors at various stages of manufacture are provided to illustrate the methods of FIGS. 7A & B. FIGS. 12A-E are directed to FIG. 7A, and FIGS. 13A-G are directed to FIG. 7B. Although FIGS. 8-11, 12A-E, and 13A-G are described in relation to the methods, it will be appreciated that the structures disclosed in FIGS. 8-11, 12A-E, and 13A-G are not limited to the methods, but instead may stand alone as structures independent of the methods. Similarly, although the methods are described in relation to FIGS. 8-11, 12A-E, and 13A-G, it will be appreciated that the methods are not limited to the structures disclosed in FIGS. 8-11, 12A-E, and 13A-G, but instead may stand alone independent of the structures disclosed in FIGS. 8-11, 12A-E, and 13A-G.

Figure 8:
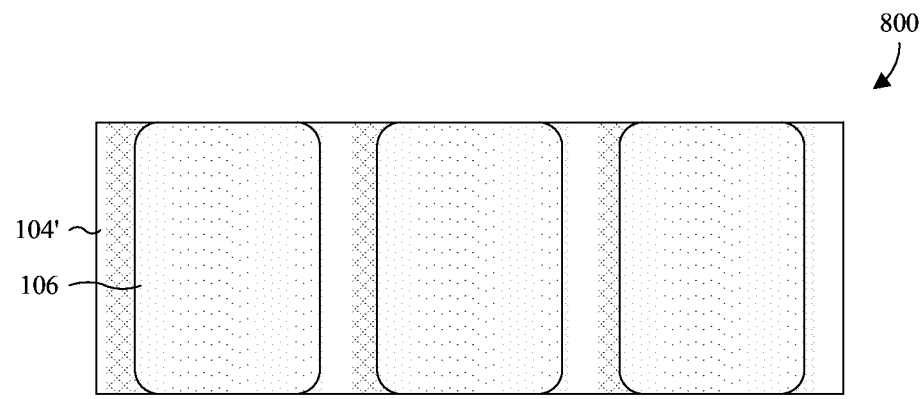
FIGS. 8-11, 12A-E, and 13A-G illustrate a series of cross-sectional views of some embodiments of the semiconductor structure of FIGS. 7A & B at various stages of manufacture.

FIG. 8 illustrates a cross-sectional view 800 of some embodiments corresponding to Act 702. As illustrated, a semiconductor substrate 104' with photodiodes 106 arranged therein is provided. The photodiodes 106 correspond to pixel sensors and are typically arranged in columns and/or rows within the semiconductor substrate 104'. In some embodiments, the semiconductor substrate 104' is part of an integrated circuit. In such embodiments, a BEOL metallization stack (not shown) of the integrated circuit underlies the semiconductor substrate 104'. Further, the photodiodes 106 partially define a device region of the integrated circuit that is electrically connected to the BEOL metallization stack. The semiconductor substrate 104' may be, for example, a bulk semiconductor substrate.

Figure 9:
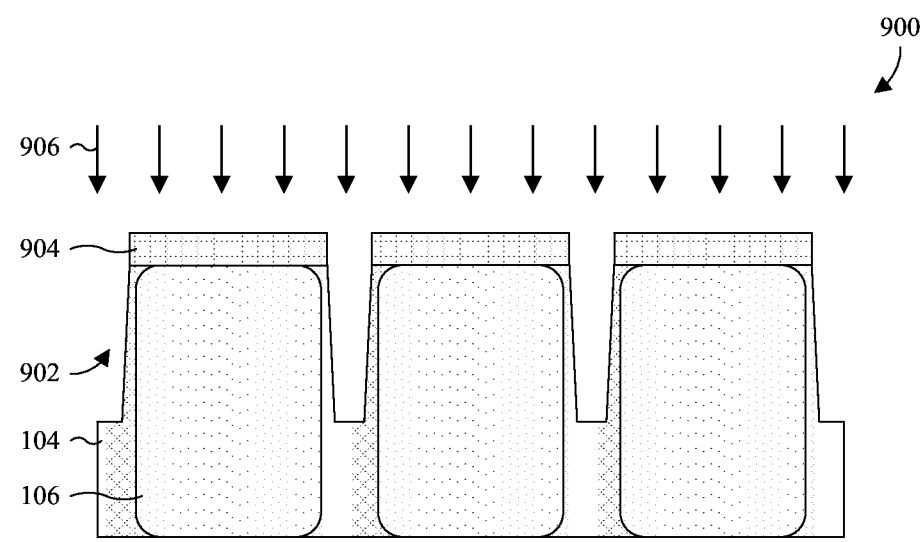

FIG. 9 illustrates a cross-sectional view 900 of some embodiments corresponding to Act 704. As illustrated, a first etch is performed into the semiconductor substrate 104', through regions of the substrate 104' surrounding and between the photodiodes 106. The first etch results in a trench 902 surrounding and between the photodiodes 106. The process for performing the first etch may include forming a photoresist layer 904 overlying the semiconductor substrate 104' and masking the photodiodes 106. Thereafter, an etchant 906 may be applied to the semiconductor substrate 104' according to the photoresist layer 904. Further, the photoresist layer 904 may be removed.

Figure 10:
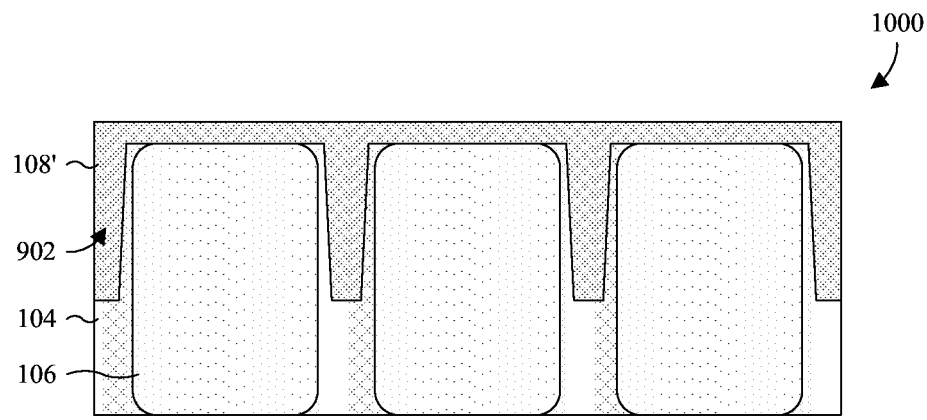

FIG. 10 illustrates a cross-sectional view 1000 of some embodiments corresponding to Act 706. As illustrated, an isolation layer 108' is formed over the remaining semiconductor substrate 104 and filling the trench 902. The isolation layer 108' may be, for example, formed using any suitable deposition technique, such as chemical vapor deposition (CVD). Further, the isolation layer 108' may be, for example, formed of a metal, such as tungsten, copper, or aluminum copper, or of a low-n material. A low-n material has a dielectric constant lower than color filters formed hereafter. In some embodiments, the low-n material is oxide (e.g., $SiO_2$) or hafnium oxide (e.g., $HfO_2$) after etching.

Figure 11:
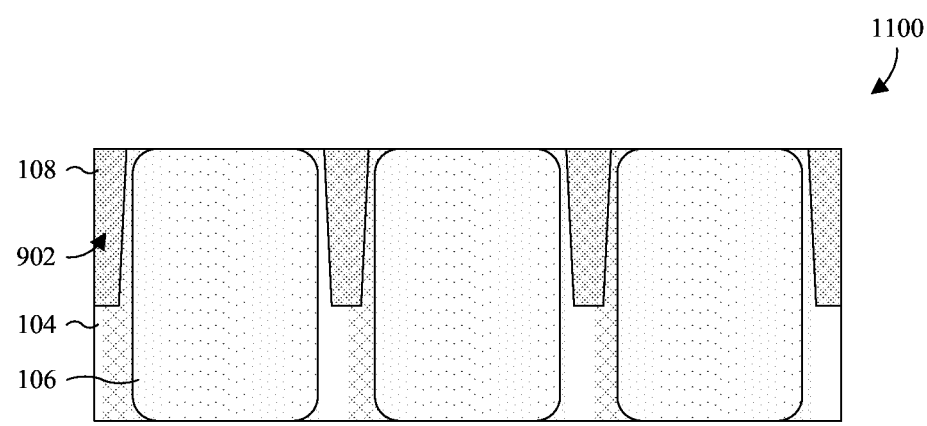

FIG. 11 illustrates a cross-sectional view 1100 of some embodiments corresponding to Act 708. As illustrated, a planarization is performed into the isolation layer 108' to about even with an upper surface of the remaining semiconductor substrate 104. The planarization forms a DTI region 108 surrounding and between the photodiodes 106. The DTI region 108 advantageously provides optical isolation between neighboring pixel sensors and photodiodes 106, thereby serving as a substrate isolation gird and reducing cross talk. The process for performing the planarization may include, for example, chemical mechanical polishing (CMP).

Figure 12A:
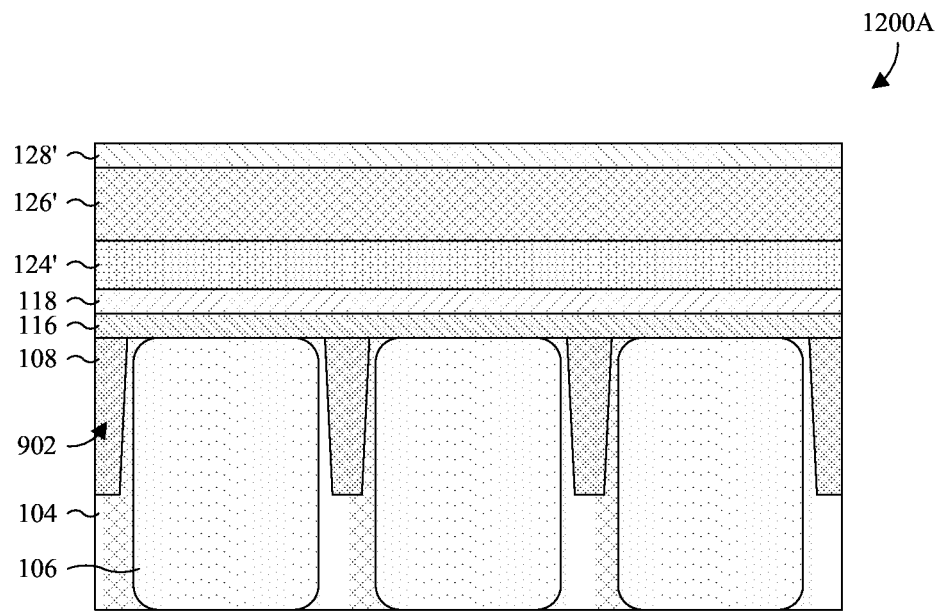

FIG. 12A illustrates a cross-sectional view 1200A of some embodiments corresponding to Act 710. As illustrated, an ARC 116, a first dielectric layer 118, a metal layer 124', a low-n layer 126', and a hard mask layer 128' are formed stacked in that order over the remaining semiconductor substrate 104. The first dielectric layer 118 may be, for example, formed of an oxide, such as silicon dioxide. The metal layer 124' may be, for example, formed of tungsten, copper, or aluminum copper. The low-n layer 126' may be, for example, formed of a material with a refractive index less than the refractive index of color filters formed hereafter. In some embodiments, the low-n layer 126' is formed of oxide, hafnium oxide, or a material with a refractive index less than silicon. The hard mask layer 128' may be, for example, formed of silicon nitride or silicon oxynitride.

Figure 12B:
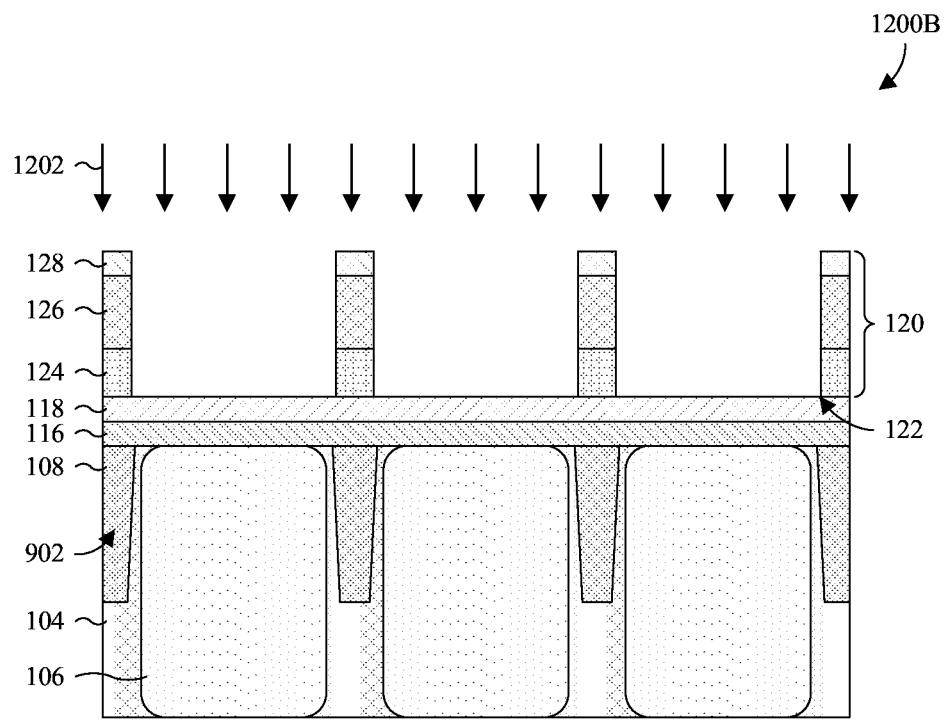

FIG. 12B illustrates a cross-sectional view 1200B of some embodiments corresponding to Act 712. As illustrated, a second etch is performed to the first dielectric layer 118, through regions of the hard mask layer 128', the low-n layer 126', and the metal layer 124' overlying the photodiodes 106. The second etch results in a composite grid 120 arranged around openings 122 overlying the photodiodes 106. The composite grid 120 includes a metal grid 128, a low-n grid 126, and a hard mask grid 124 stacked in that order around the openings 122 and the photodiodes 106. Typically, the opening 122 and the photodiodes 106 share approximately the same footprint and are centrally aligned. In other embodiments, the openings 122 may be laterally shifted or offset in at least one direction from the photodiodes 106 so that the composite grid 120 at least partially overlies the photodiodes 106.

The process for performing the second etch may include forming a photoresist layer masking regions of the hard mask layer 128' corresponding to the composite grid 120. An etchant may then be applied to the hard mask layer 128' according to a pattern of the photoresist layer, thereby defining the hard mask grid 128. The etchant may be selective of the hard mask layer 128' relative to the low-n layer 126'. With the hard mask grid 128 defined, the photoresist layer may be removed and one or more additional etchants 1202 may be applied to the low-n layer 126' and the metal layer 124' according to a pattern of the hard mask grid 128.

Figure 12C:
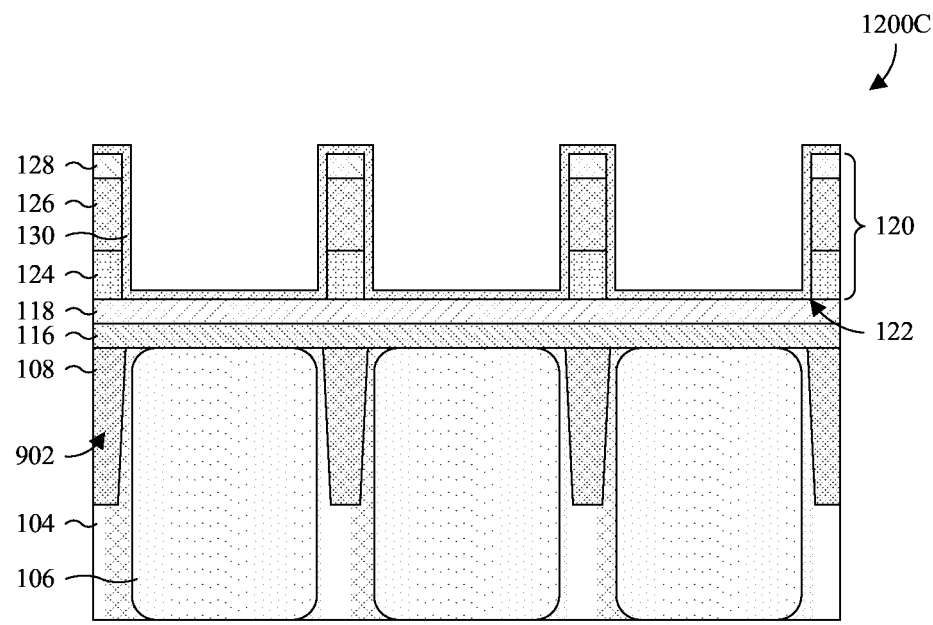

FIG. 12C illustrates a cross-sectional view 1200C of some embodiments corresponding to Act 714. As illustrated, a second dielectric layer 130 is formed lining an upper surface of the composite grid 120, and lining the openings 122. Typically, the second dielectric layer 130 is formed using a conformal deposition technique, such as, for example, CVD. The second dielectric layer 130 may be, for example, formed of an oxide, such as silicon dioxide.

Figure 12D:
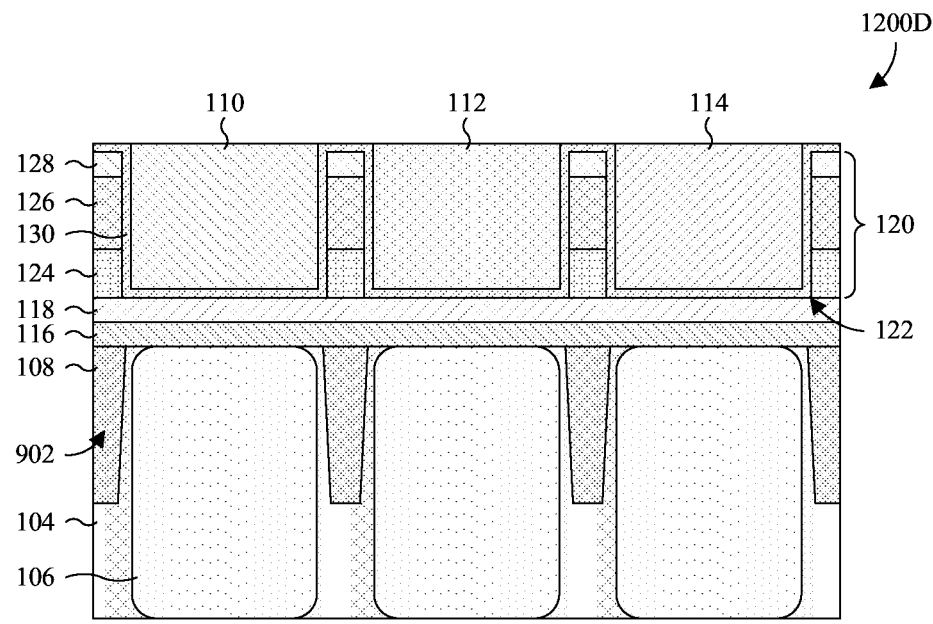

FIG. 12D illustrates a cross-sectional view 1200D of some embodiments corresponding to Act 716. As illustrated, color filters 110, 112, 114 corresponding to pixel sensors are formed in the openings 122 of the corresponding pixel sensors with upper surfaces approximate even with an upper surface of the composite grid 120 and/or the second dielectric layer 130. Further, the color filters 110, 112, 114 are formed with assigned colors. Typically, the color filters 110, 112, 114 are alternatingly formed with assigned colors of red, green, and blue.

The process for forming the color filters 110, 112, 114 may include, for each of the different colors of the color assignments, forming a color filter layer and patterning the color filter layer. The color filter layer may be formed so as to fill exposed regions of the openings 122 and to cover exposed regions of the composite grid upper surface. The color filter layer may then be planarized and/or etched back to about even with the composite grid upper surface, before patterning the color filter layer.

Figure 12E:
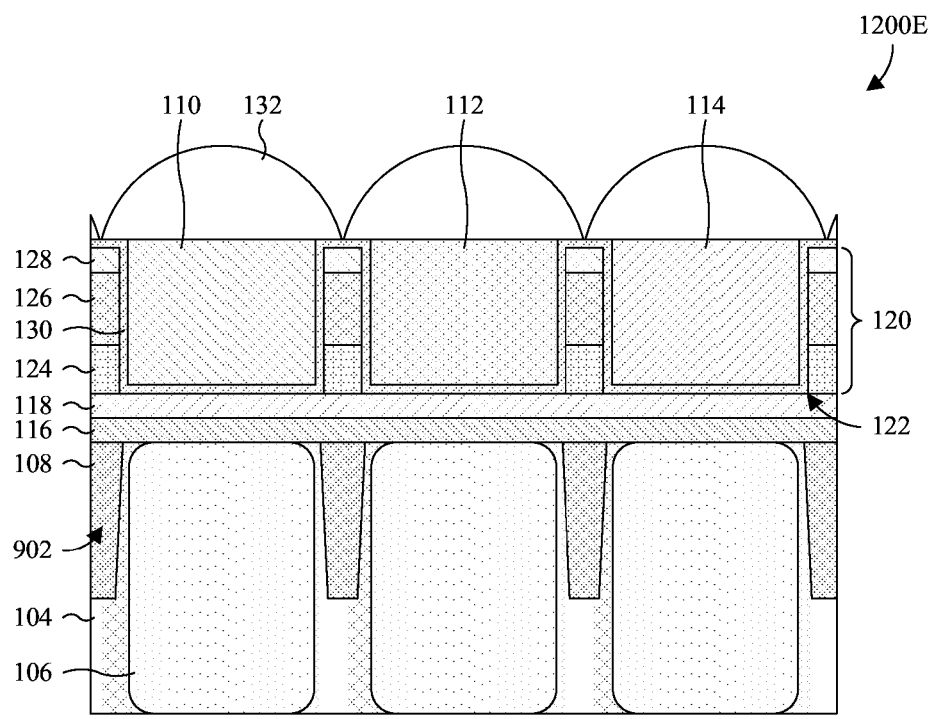

FIG. 12E illustrates a cross-sectional view 1200E of some embodiments corresponding to Act 718. As illustrated, micro lenses 132 corresponding to the pixel sensors are formed over the color filters 110, 112, 114 of the corresponding pixel sensors. In some embodiments, the micro lenses 132 may be laterally shifted or offset in at least one direction from the photodiodes 106.

Figure 13A:
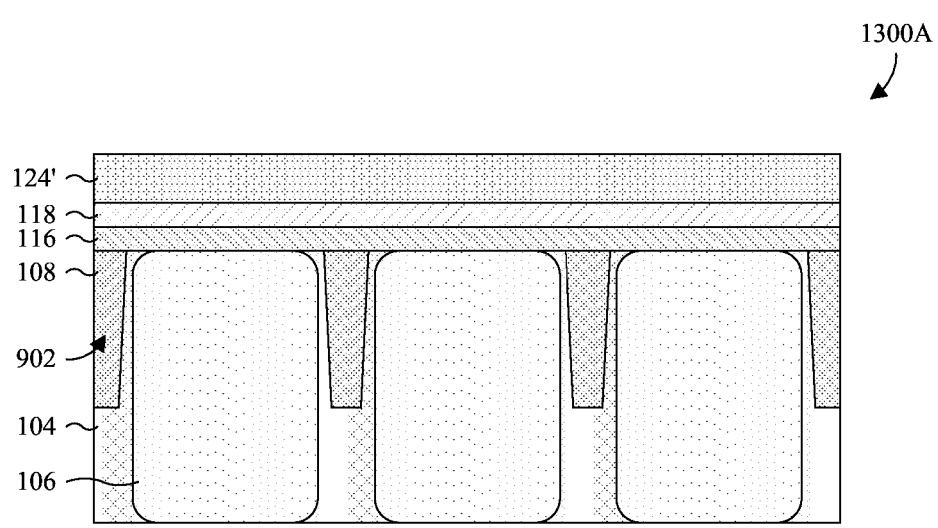

FIG. 13A illustrates a cross-sectional view 1300A of some embodiments corresponding to Act 720. As illustrated, an ARC 116, a first dielectric layer 118, and a metal layer 124' are formed stacked in that order over the remaining semiconductor substrate 104. The first dielectric 118 may be, for example, formed of an oxide, such as silicon dioxide. The metal layer 124' may be, for example, formed of tungsten, copper, or aluminum copper.

Figure 13B:
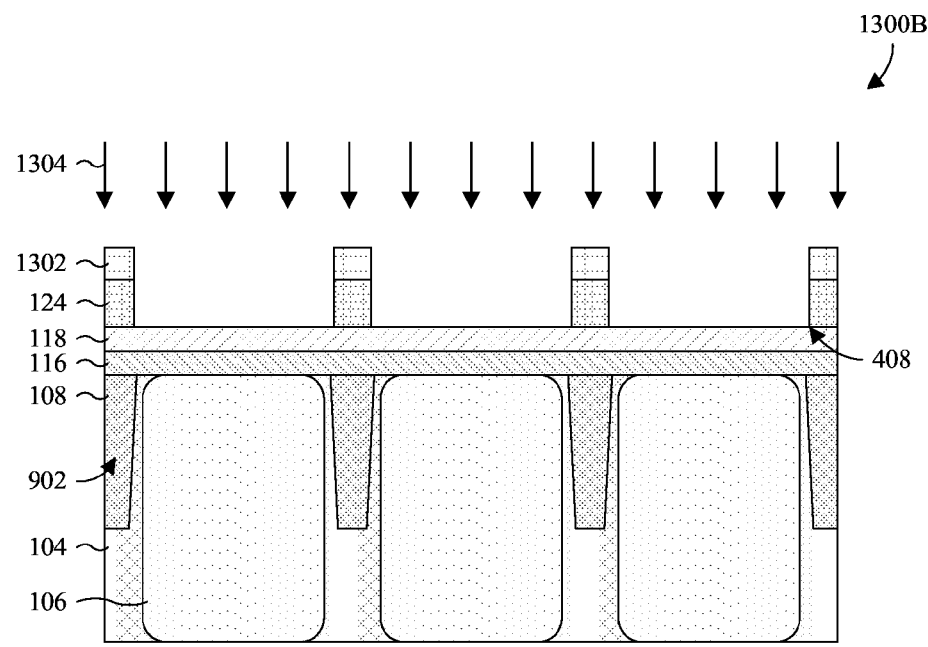

FIG. 13B illustrates a cross-sectional view 1300B of some embodiments corresponding to Act 722. As illustrated, a second etch is performed to the first dielectric layer 118, through regions of the metal layer 124' overlying the photodiodes 106. The second etch results in a metal grid 124 arranged around first openings 408, which overly corresponding ones of the photodiodes 106. Typically, the first openings 408 and the photodiodes 106 share approximately the same footprint and are centrally aligned. In other embodiments, the first openings 408 may be laterally shifted or offset in at least one direction from the photodiodes 106 so that the metal grid 124 at least partially overlies the photodiodes 106.

The process for performing the second etch may include forming a photoresist layer 1302 masking regions of the metal layer 124' corresponding to the metal grid 124. An etchant 1304 may then be applied to the metal layer 124' according to a pattern of the photoresist layer 1302, thereby defining the metal grid 124. The etchant 1304 may be selective of the metal layer 124' relative to the first dielectric layer 118. With the metal grid 124 defined, the photoresist layer 1302 may be removed.

Figure 13C:
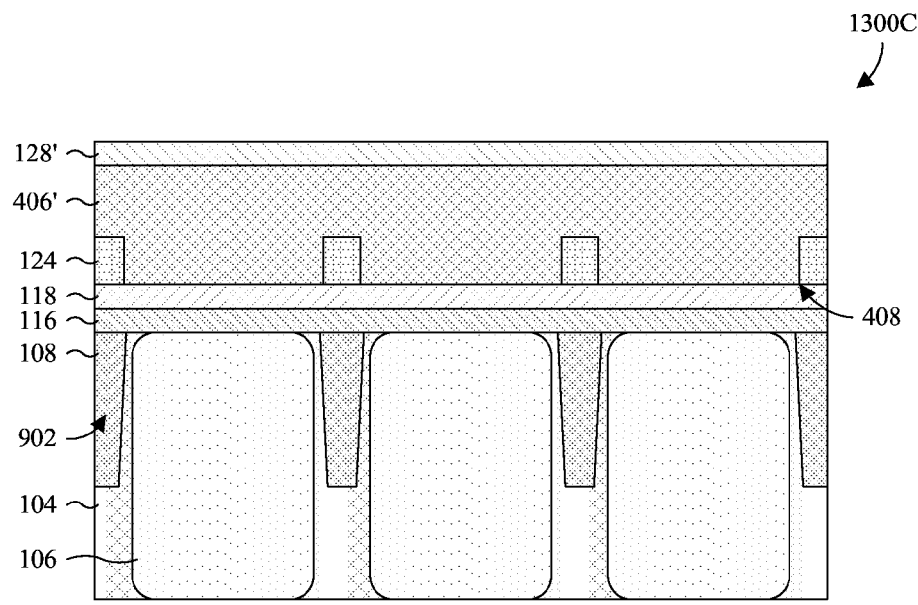

FIG. 13C illustrates a cross-sectional view 1300C of some embodiments corresponding to Act 724. As illustrated, a low-n layer 406' and a hard mask layer 128' are formed stacked in that order over the metal grid 124. Further, the low-n layer 406' is formed filling the first openings 408. In some embodiments, the process for forming the low-n layer 406' includes depositing an intermediate layer and planarizing the intermediate layer using a CMP. The low-n layer 406' is formed of a material with a refractive index less than the refractive index of color filters formed hereafter. In some embodiments, the low-n layer 406' is formed of oxide, hafnium oxide, or a material with a refractive index less than silicon. The hard mask layer 128' may be, for example, formed of silicon nitride or silicon oxynitride.

Figure 13D:
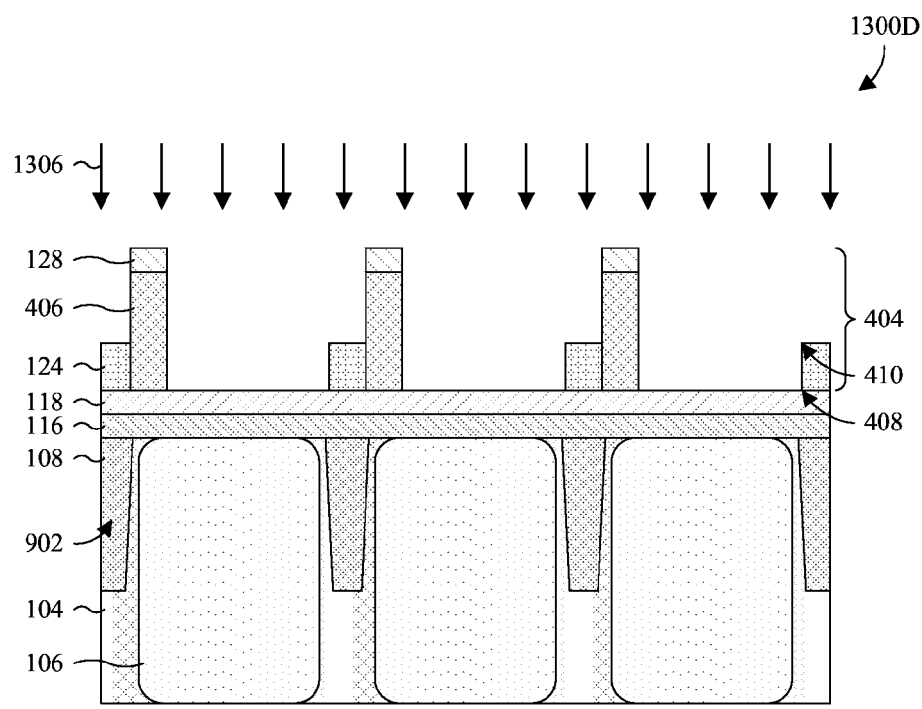

FIG. 13D illustrates a cross-sectional view 1300D of some embodiments corresponding to Act 726. As illustrated, a third etch is performed to the first dielectric layer 118, through regions of the hard mask layer 128' and the low-n layer 406' overlying the photodiodes 106. The second etch results in a low-n grid 406 and a hard mask grid 128 stacked in that order, and arranged around second openings 410 at least partially overlying the photodiodes 106. The second openings 410 are laterally shifted or offset in at least one direction from the photodiodes 106 so sidewalls of the low-n grid 406 abut sidewalls of the metal grid 124. Typically, the second opening 410 and the photodiodes 106 share approximately the same footprint. The second etch further results in a composite grid 404 including the hard mask grid 128, the low-n grid 406, and the metal grid 124.

The process for performing the third etch may include forming a photoresist layer masking regions of the hard mask layer 128' corresponding to the hard mask grid 128. An etchant may then be applied to the hard mask layer 128' according to a pattern of the photoresist layer, thereby defining the hard mask grid 128. The etchant may be selective of the hard mask layer 128' relative to the low-n layer 406'. With the hard mask grid 128 defined, the photoresist layer may be removed and an additional etchant 1306 may be applied to the low-n layer 406' according to a pattern of the hard mask grid 128.

Figure 13E:
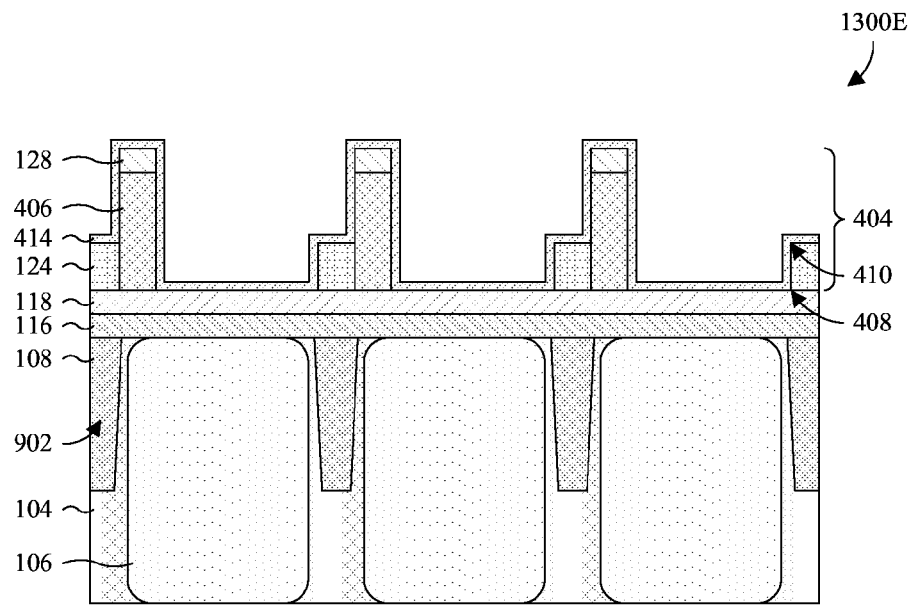

FIG. 13E illustrates a cross-sectional view 1300E of some embodiments corresponding to Act 728. As illustrated, a second dielectric layer 414 is formed lining an upper surface of the composite grid 404, and lining the first and second openings 408, 410. Typically, the second dielectric layer 414 is formed using a conformal deposition technique. The second dielectric layer 414 may be, for example, formed of an oxide, such as silicon dioxide.

Figure 13F:
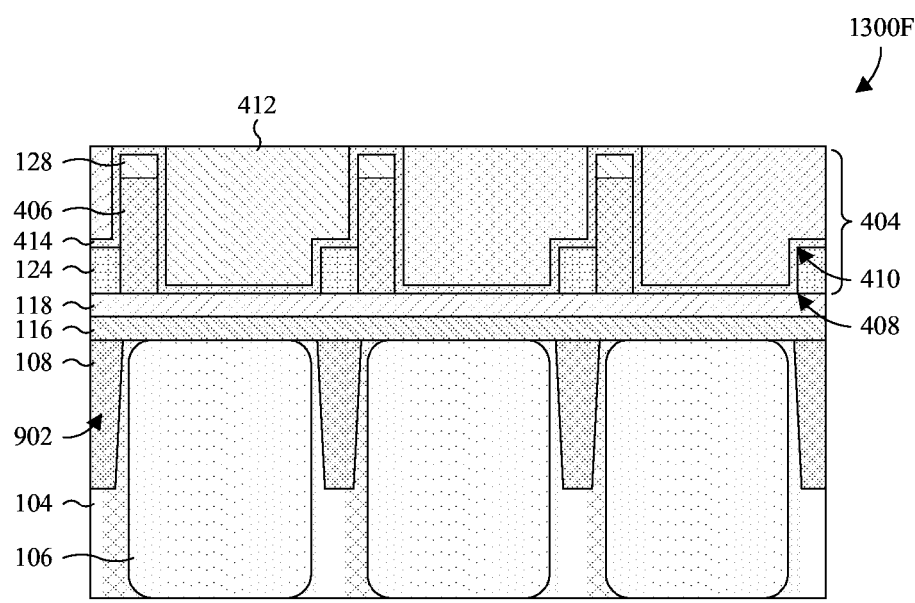

FIG. 13F illustrates a cross-sectional view 1300F of some embodiments corresponding to Act 730. As illustrated, color filters 412 corresponding to the pixel sensors are formed in the first and second openings 408, 410 of the corresponding pixel sensors. Further, the color filters 412 are formed with upper surfaces approximately even with an upper surface of the composite grid 404 and/or the second dielectric layer 414. Even more, the color filters 412 are formed with assigned colors. Typically, the color filters are alternatingly formed with assigned colors of red, green, and blue.

Figure 13G:
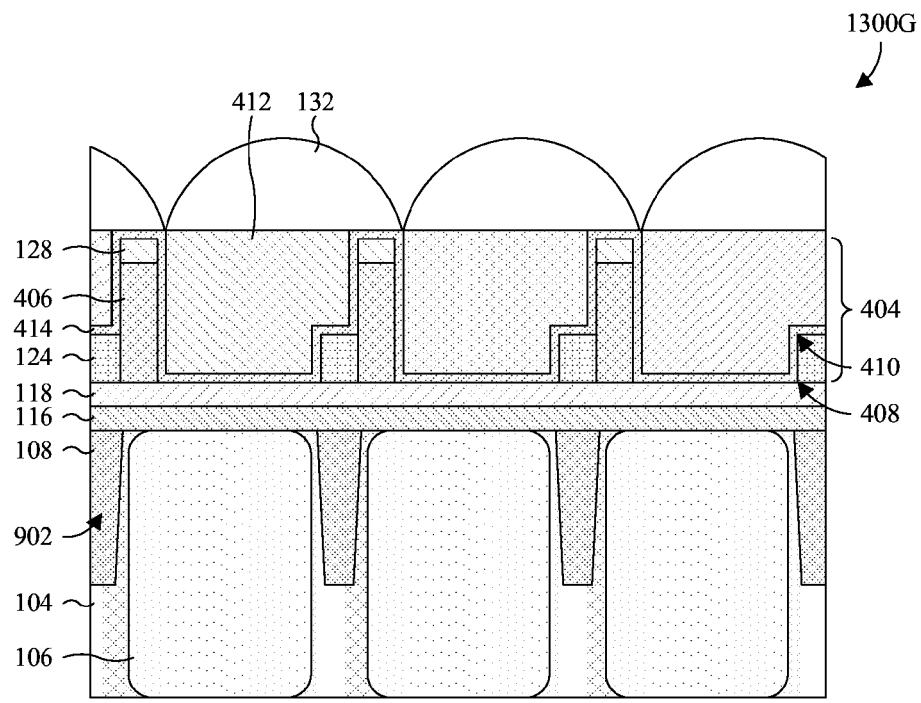

FIG. 13G illustrates a cross-sectional view 1300G of some embodiments corresponding to Act 732. As illustrated, micro lenses 132 corresponding to the pixel sensors are formed over the color filters 412 of the corresponding pixel sensors. In some embodiments, the micro lenses 132 may be laterally shifted or offset from the photodiodes 106.

Figure 14:
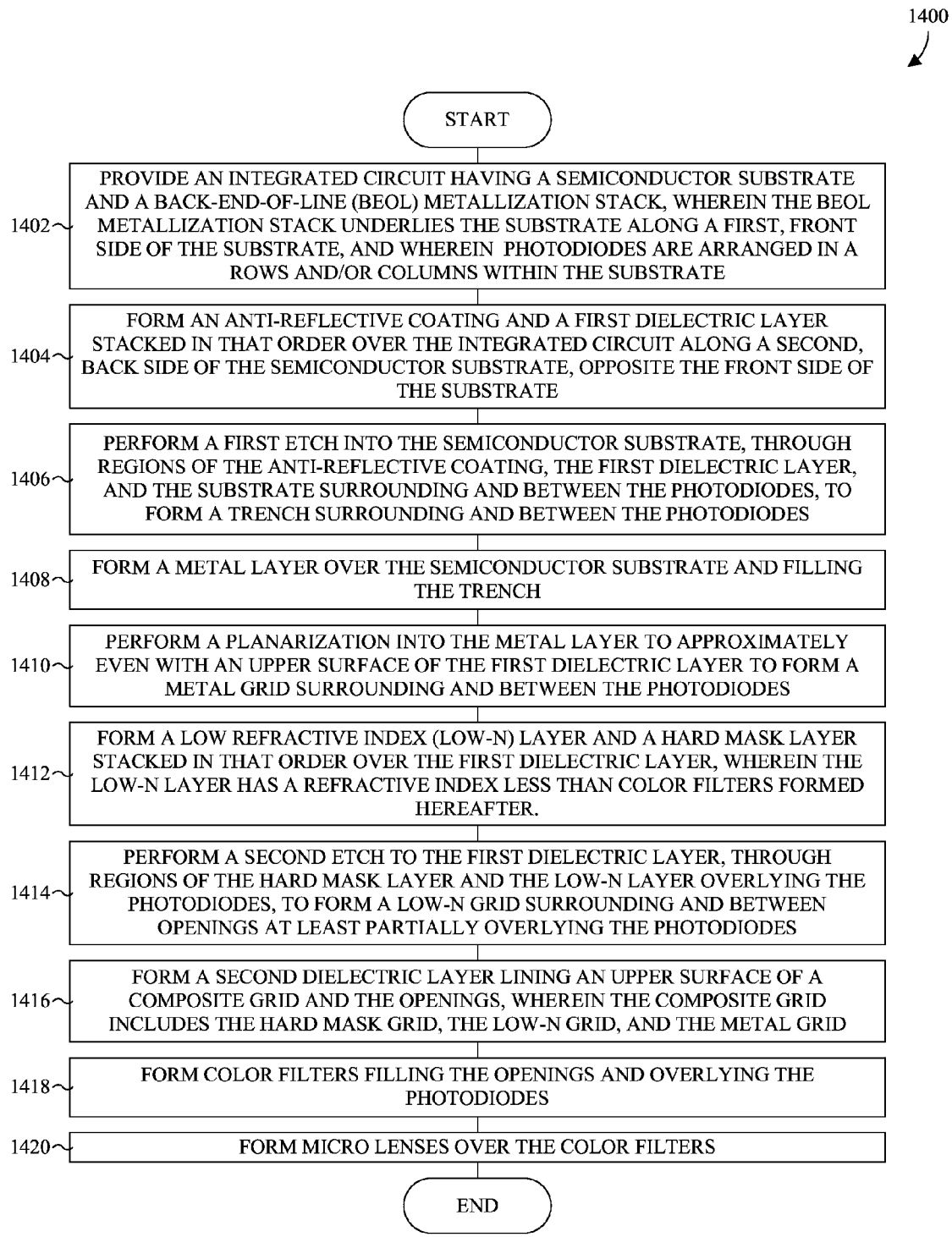
FIG. 14 illustrates a flowchart of other more detailed embodiments of the method of FIG. 6 in which a semiconductor structure for BSI pixel sensors is manufactured.

With reference to FIG. 14, a flowchart 1400 of other more detailed embodiments of the method of FIG. 6 is provided. As seen hereafter, the more detailed embodiments are directed to BSI pixel sensors with an extended metal grid.

At 1402, an integrated circuit having a semiconductor substrate and a BEOL metallization stack is provided. The BEOL metallization stack underlies the substrate along a first, front side of the substrate, and photodiodes are arranged in a rows and/or columns within the substrate.

At 1404, an anti-reflective coating and a first dielectric layer are formed stacked in that order over the integrated circuit along a second, back side of the semiconductor substrate, opposite the front side of the substrate.

At 1406, a first etch is performed into the semiconductor substrate, through regions of the anti-reflective coating, the first dielectric layer, and the substrate surrounding and between the photodiodes. The first etch forms a trench surrounding and between the photodiodes.

At 1408, a metal layer is formed over the semiconductor substrate and filling the trench.

At 1410, a planarization is performed into the metal layer to approximately even with an upper surface of the first dielectric layer to form a metal grid surrounding and between the photodiodes. The metal grid defines or otherwise forms part of a substrate isolation grid.

At 1412, a low-n layer and a hard mask layer are formed stacked in that order over the first dielectric layer. The low-n layer has a refractive index less than color filters formed hereafter.

At 1414, a second etch is performed to the first dielectric layer, through regions of the hard mask layer and the low-n layer overlying the photodiodes. The second etch forms a low-n grid surrounding and between openings at least partially overlying the photodiodes.

At 1416, a second dielectric layer is formed lining an upper surface of a composite grid and the openings. The composite grid includes the hard mask grid, the low-n grid, and the metal grid.

At 1418, color filters are formed filling the openings and overlying the photodiodes.

At 1420, micro lenses are formed over the color filters.

While the method described by the flowchart 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 15-24, cross-sectional views of some embodiments of a semiconductor structure for BSI pixel sensors at various stages of manufacture are provided to illustrate the method of FIG. 14. Although FIGS. 15-24 are described in relation to the method, it will be appreciated that the structures disclosed in FIGS. 15-24 are not limited to the method, but instead may stand alone as structures independent of the method. Similarly, although the method is described in relation to FIGS. 15-24, it will be appreciated that the method is not limited to the structures disclosed in FIGS. 15-24, but instead may stand alone independent of the structures disclosed in FIGS. 15-24.

Figure 15:
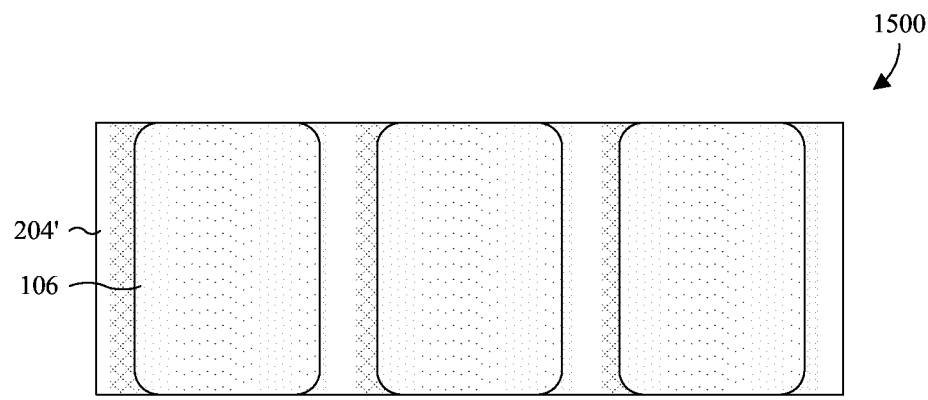
FIGS. 15-24 illustrate a series of cross-sectional views of some embodiments of the semiconductor structure of FIG. 14 at various stages of manufacture.

FIG. 15 illustrates a cross-sectional view 1500 of some embodiments corresponding to Act 1402. As illustrated, a semiconductor substrate 204' with photodiodes 106 arranged therein is provided. In some embodiments, the semiconductor substrate 204' is part of an integrated circuit. In such embodiments, a BEOL metallization stack (not shown) of the integrated circuit underlies the semiconductor substrate 204'. The semiconductor substrate 204' may be, for example, a bulk semiconductor substrate.

Figure 16:
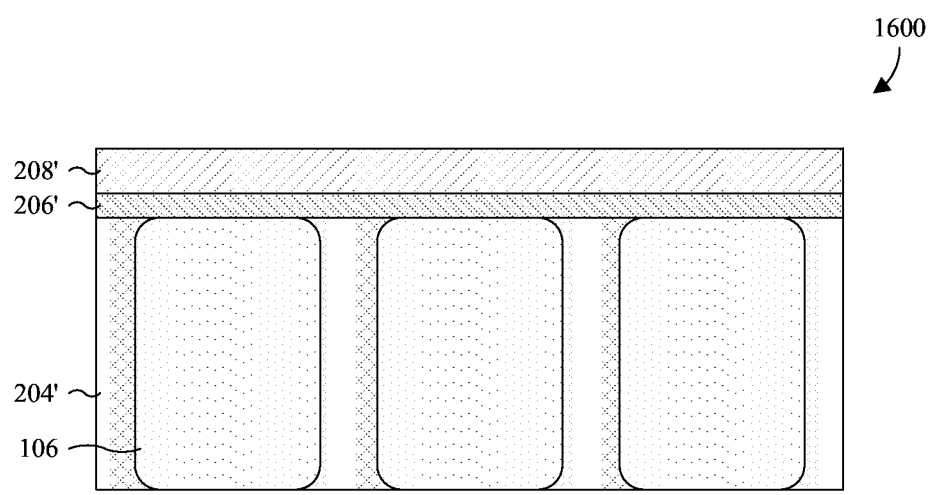

FIG. 16 illustrates a cross-sectional view 1600 of some embodiments corresponding to Act 1404. As illustrated, an ARC 206' and a first dielectric layer 208' are formed stacked in that order over the semiconductor substrate 204'. The first dielectric layer 208' may be, for example, formed of an oxide, such as silicon dioxide.

Figure 17:
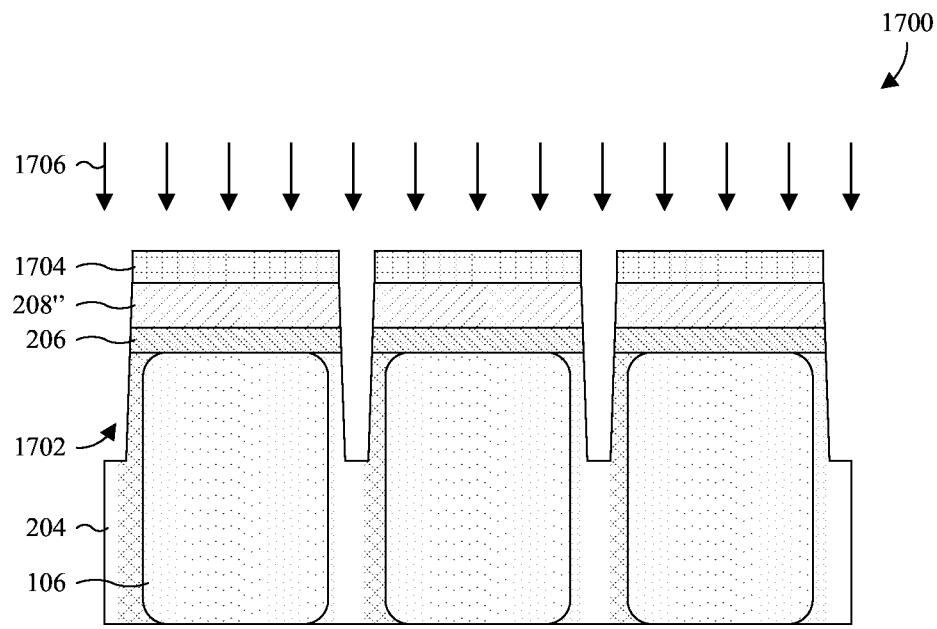

FIG. 17 illustrates a cross-sectional view 1700 of some embodiments corresponding to Act 1406. As illustrated, a first etch is performed into the semiconductor substrate 204', through regions of the ARC 206', the first dielectric layer 208', and the substrate 204' surrounding and between the photodiodes 106. The first etch results in a trench 1702 surrounding and between the photodiodes 106. The process for performing the first etch may include forming a photoresist layer 1704 overlying the first dielectric layer 208' and masking the photodiodes 106. Thereafter, one or more etchants 1706 may be applied to the ARC 206', the first dielectric layer 208', and the substrate 204' according to the photoresist layer 904. After applying the etchants 1706, the photoresist layer 1704 may be removed.

Figure 18:
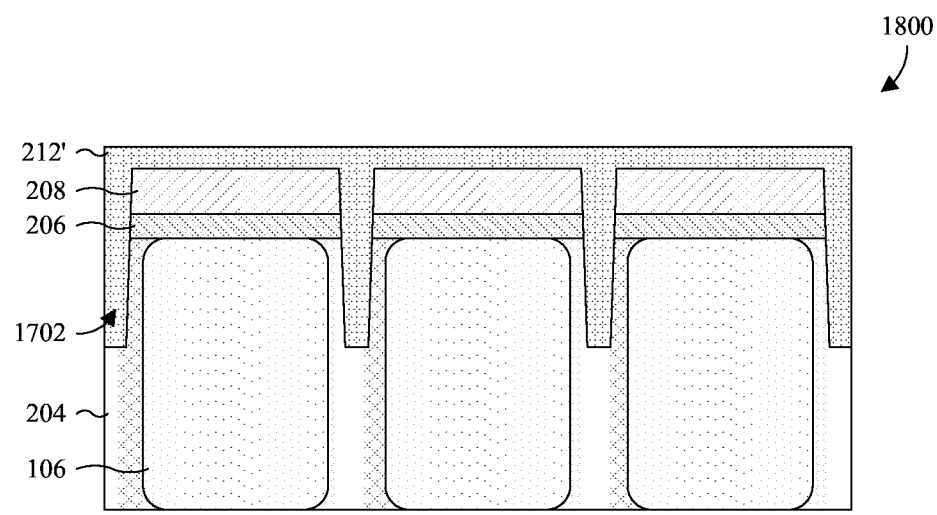

FIG. 18 illustrates a cross-sectional view 1800 of some embodiments corresponding to Act 1408. As illustrated, a metal layer 212' is formed over the remaining first dielectric layer 208" and filling the trench 1702. The metal layer 212' may be, for example, formed using any suitable deposition technique, such as CVD. Further, the metal layer 212' may be, for example, formed of tungsten, copper, or aluminum copper. As seen hereafter, the metal layer 212' serves as an isolation layer for optical isolation.

Figure 19:
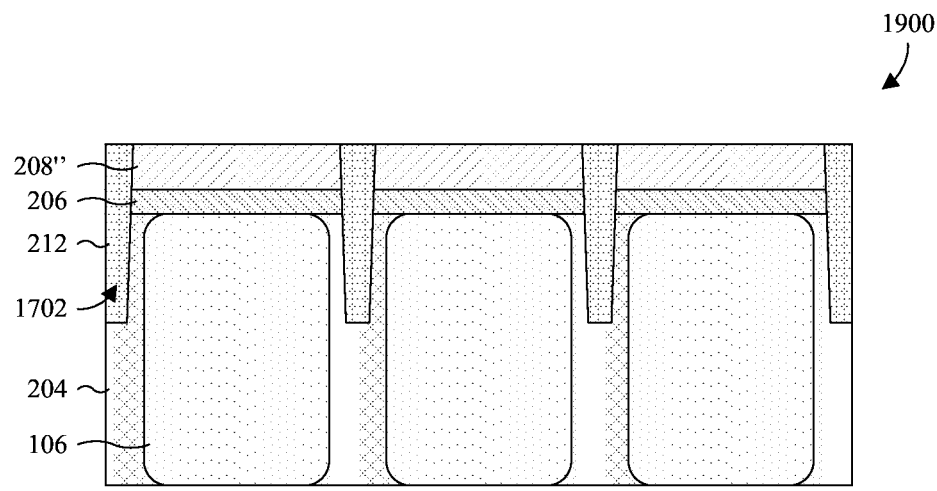

FIG. 19 illustrates a cross-sectional view 1900 of some embodiments corresponding to Act 1410. As illustrated, a planarization is performed into the metal layer 212' to about even with an upper surface of the remaining first dielectric layer 208". The planarization forms a metal grid 212 surrounding and between the photodiodes 106. The metal grid 212 advantageously provides optical isolation between neighboring pixel sensors and photodiodes 106, thereby serves as a substrate isolation grid and reduces cross talk. The process for performing the planarization may include, for example, a CMP and/or an etch back.

Figure 20:
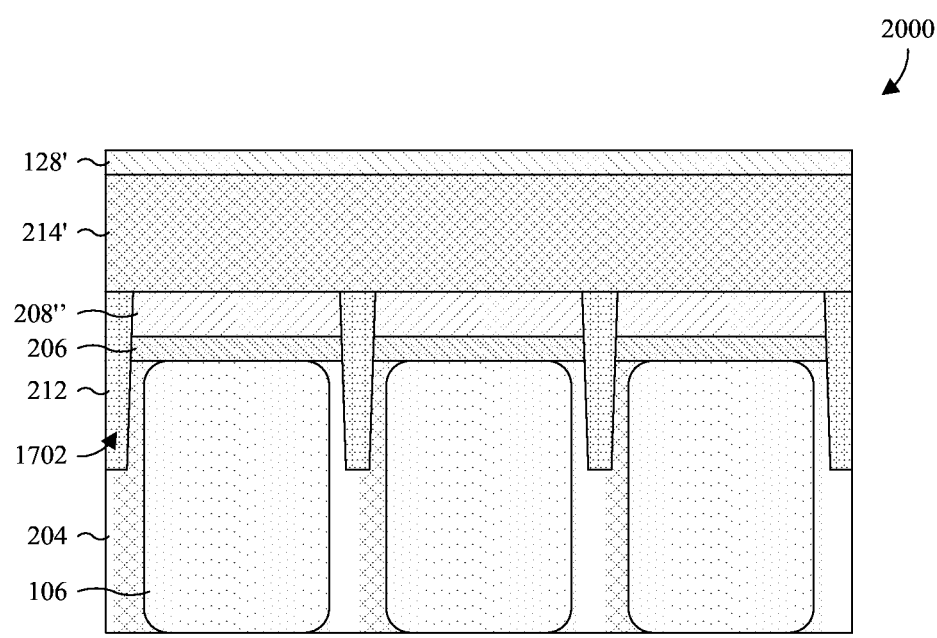

FIG. 20 illustrates a cross-sectional view 2000 of some embodiments corresponding to Act 1412. As illustrated, a low-n layer 214' and a hard mask layer 128' are formed stacked in that order over the metal grid 212. The low-n layer 214' is formed of a material with a refractive index less than the refractive index of color filters formed hereafter. In some embodiments, the low-n layer 214' is formed of oxide, hafnium oxide, or a material with a refractive index less than silicon. The hard mask layer 128' may be, for example, formed of silicon nitride.

Figure 21:
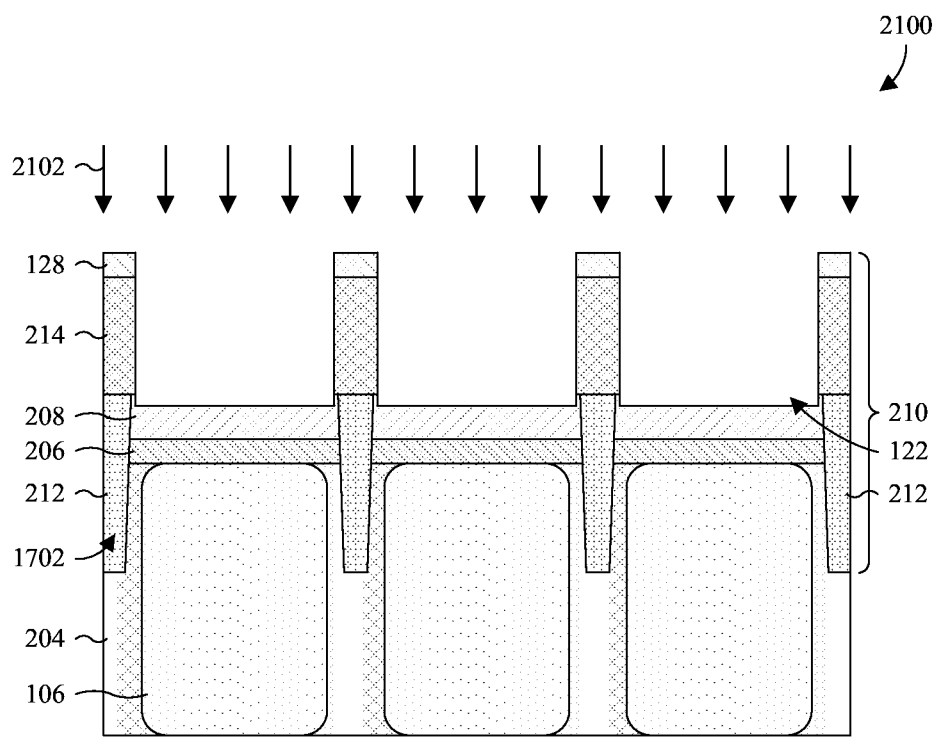

FIG. 21 illustrates a cross-sectional view 2100 of some embodiments corresponding to Act 1414. As illustrated, a second etch is performed to the remaining first dielectric layer 208", through regions of the hard mask layer 128' and the low-n layer 214' overlying the photodiodes 106. In some embodiments, the second etch is also performed into, but not through, regions of the remaining first dielectric layer 208" overlying the photodiodes 106. The second etch results in a low-n grid 214 and a hard mask grid 128 stacked in that order, and arranged around openings 122 at least partially overlying the photodiodes 106. The second etch further results in a composite grid 210 including the hard mask grid 128, the low-n grid 214, and the metal grid 212. Typically, as illustrated, the openings 122 are centered on the photodiodes 106, and the low-n and hard mask grids 128, 214 are stacked over the metal grid 212. However, in other embodiments, the openings 122 are laterally shifted or offset from the photodiodes 106, and the low-n and hard mask grids 128, 214 are laterally shifted or offset from the metal grid 212.

The process for performing the second etch may include forming a photoresist layer masking regions of the hard mask layer 128' corresponding to the hard mask grid 128. An etchant may then be applied to the hard mask layer 128' according to a pattern of the photoresist layer, thereby defining the hard mask grid 128. The etchant may be selective of the hard mask layer 128' relative to the low-n layer 214'. With the hard mask grid 128 defined, the photoresist layer may be removed and an additional etchant 2102 may be applied to the low-n layer 214' according to a pattern of the hard mask grid 128.

Figure 22:
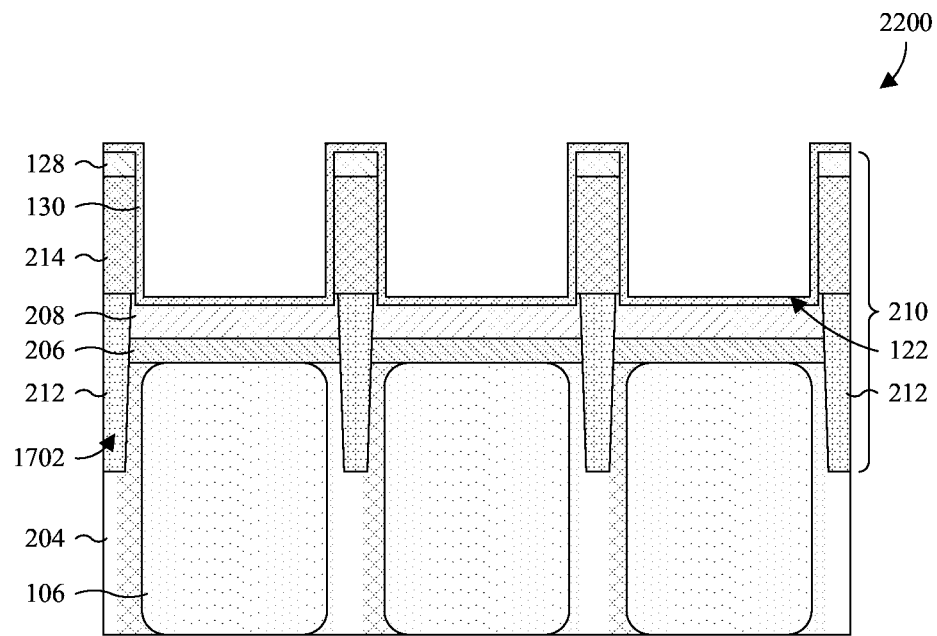

FIG. 22 illustrates a cross-sectional view 2200 of some embodiments corresponding to Act 1416. As illustrated, a second dielectric layer 130 is formed lining an upper surface of the composite grid 210, and lining the openings 122. Typically, the second dielectric layer 130 is formed using a conformal deposition technique. The second dielectric layer 130 may be, for example, formed of an oxide, such as silicon dioxide.

Figure 23:
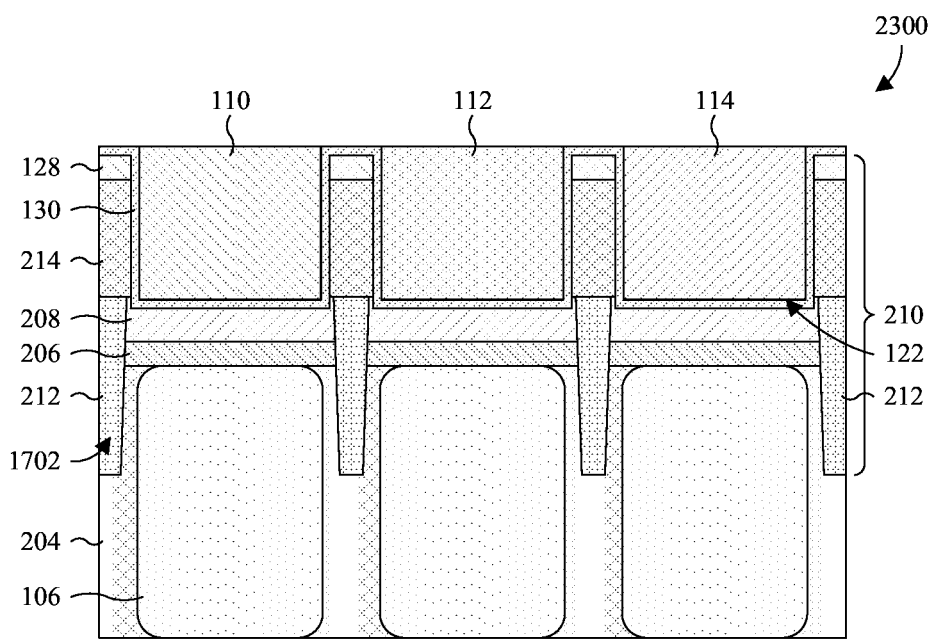

FIG. 23 illustrates a cross-sectional view 2300 of some embodiments corresponding to Act 1418. As illustrated, color filters 110, 112, 114 corresponding to the pixel sensors are formed in the openings 122 of the corresponding pixel sensors. Further, the color filters 110, 112, 114 are formed with upper surfaces approximately even with an upper surface of the composite grid 210 and/or the second dielectric layer 130. Even more, the color filters 110, 112, 114 are formed with assigned colors. Typically, the color filters are alternatingly formed with assigned colors of red, green, and blue.

Figure 24:
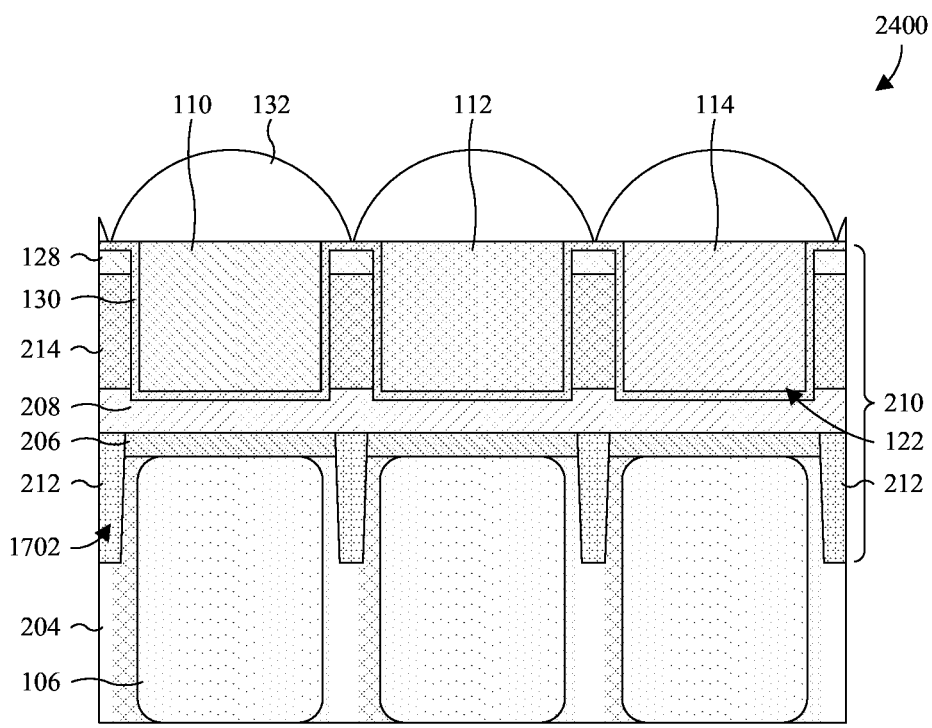

FIG. 24 illustrates a cross-sectional view 2400 of some embodiments corresponding to Act 1420. As illustrated, micro lenses 132 corresponding to the pixel sensors are formed over the color filters 110, 112, 114 of the corresponding pixel sensors. In some embodiments, the micro lenses 132 may be laterally shifted or offset from the photodiodes 106.

Thus, as can be appreciated from above, the present disclosure provides a semiconductor structure for BSI pixel sensors. A plurality of photodiodes is arranged within a semiconductor substrate. A metal grid overlies the semiconductor substrate and is made up of a plurality of metal grid segments that surround outer perimeters of the plurality of photodiodes, respectively, such that a plurality of first openings within the metal grid overlie the plurality of photodiodes, respectively. A low-n is grid made up of a plurality of low-n grid segments that surround the respective outer perimeters of the plurality of photodiodes, respectively, such that a plurality of second openings within the low-n grid overlie the plurality of photodiodes, respectively. Color filters are arranged in the first and second openings of the corresponding photodiodes and have a refractive index greater than a refractive index of the low-n grid. A substrate isolation grid extends into the semiconductor substrate and is made up of a plurality of isolation grid segments that surround outer perimeters of the plurality of photodiodes, respectively. The substrate isolation grid is a metal or a low-n material having a refractive index less than a refractive index of the color filters.

In other embodiments, the present disclosure provides a method for manufacturing a semiconductor structure for BSI pixel sensors. Photodiodes are formed within a semiconductor substrate. A first etch is performed into the semiconductor substrate through regions of the semiconductor substrate around and between the photodiodes to form a trench. An isolation layer is formed over the semiconductor substrate and filling the trench. A planarization of the isolation layer is performed to remove lateral stretches and to form a substrate isolation grid. A low-n layer is formed over the substrate isolation grid. A hard mask layer is formed over the low-n layer. A second etch is performed through regions of the low-n layer and the hard mask layer overlying the photodiodes to form a low-n grid and a hard mask grid collectively defining openings overlying corresponding ones of the photodiodes. Color filters are formed in the openings over the corresponding photodiodes. The color filters are formed having a refractive index greater than a refractive index of the low-n layer.

In yet other embodiments, the present disclosure provides a semiconductor structure for a BSI image sensor package. An integrated circuit includes a semiconductor substrate and a BEOL metallization stack. Photodiodes are arranged in the semiconductor substrate and the BEOL metallization stack underlies the semiconductor substrate. A low-n grid and a hard mask grid collectively define openings overlying the semiconductor substrate and corresponding to ones of the photodiodes. The hard mask grid masks the low-n grid. Color filters are arranged in the openings of the corresponding photodiodes and have a refractive index greater than a refractive index of the low-n grid. A substrate isolation grid underlies the low-n grid and extends into the semiconductor substrate between and around the photodiodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for back side illumination (BSI) pixel sensors, the semiconductor structure comprising:
   a plurality of photodiodes arranged within a semiconductor substrate;
   a metal grid overlying the semiconductor substrate and made up of a plurality of metal grid segments that surround outer perimeters of the plurality of photodiodes, respectively, such that a plurality of first openings within the metal grid overlie the plurality of photodiodes, respectively;
   a low refractive index (low-n) grid made up of a plurality of low-n grid segments that surround the outer perimeters of the plurality of photodiodes, respectively, such that a plurality of second openings within the low-n grid overlie the plurality of photodiodes, respectively;
   color filters arranged in the first and second openings and having a refractive index greater than a refractive index of the low-n grid; and
   a substrate isolation grid extending into the semiconductor substrate and made up of a plurality of isolation grid segments that surround the outer perimeters of the plurality of photodiodes, respectively, wherein the substrate isolation grid is a metal or a low-n material having a refractive index less than a refractive index of the color filters.

2. The semiconductor structure according to claim 1, wherein the substrate isolation grid is continuous with the metal grid such that the metal grid extends into the semiconductor substrate between and around the photodiodes.

3. The semiconductor structure according to claim 1, wherein the substrate isolation grid is distinct from the metal grid and has an upper surface that is about even with an upper surface of the semiconductor substrate.

4. The semiconductor structure according to claim 1, further including:
   an anti-reflective coating overlying the semiconductor substrate; and
   a dielectric layer overlying the anti-reflective coating;
   wherein the metal grid has an upper surface that is about even with an upper surface of the dielectric layer.

5. The semiconductor structure according to claim 1, wherein the first openings and the second openings are laterally offset from the photodiodes, so that the metal grid and the low-n grid partially cover the photodiodes.

6. The semiconductor structure according to claim 1, wherein the first openings, the second openings, and the photodiodes share a footprint, and wherein the first and second openings are centered on centers of the corresponding photodiodes.

7. The semiconductor structure according to claim 1, wherein the metal grid and the low-n grid have edges that are aligned to one another.

8. The semiconductor structure according to claim 1, wherein the low-n grid is laterally offset from the metal grid so sidewalls of the metal and low-n grids abut.

9. The semiconductor structure according to claim 1, further including:

an integrated circuit disposed on the semiconductor substrate and a back-end-of-line (BEOL) metallization stack underlying the semiconductor substrate.

10. The semiconductor structure according to claim 1, further including:
micro lenses arranged over the color filters.

11. The semiconductor structure according to claim 1, wherein the substrate isolation grid is arranged over the semiconductor substrate and under the low-n grid, and wherein the low-n grid adjoins the metal grid.

12. A semiconductor structure for a back side illumination (BSI) image sensor package, the semiconductor structure comprising:
an integrated circuit comprising a semiconductor substrate and a back-end-of-line (BEOL) metallization stack, wherein photodiodes are arranged in the semiconductor substrate and the BEOL metallization stack underlies the semiconductor substrate;
a low refractive index (low-n) grid and a hard mask grid collectively defining openings overlying the semiconductor substrate and corresponding to the photodiodes, wherein the hard mask grid masks the low-n grid;
color filters arranged in the openings and having a refractive index greater than a refractive index of the low-n grid; and
a substrate isolation grid underlying the low-n grid and extending into the semiconductor substrate between and around the photodiodes, wherein the substrate isolation grid is conductive and has a top surface spaced over a top surface of the semiconductor substrate.

13. The semiconductor structure according to claim 12, wherein a bottom surface of the low-n grid is arranged over a top surface of the substrate isolation grid, and wherein the openings are symmetrical about vertical axes arranged respectively at width-wise centers of the openings.

14. The semiconductor structure according to claim 12, wherein the substrate isolation grid is arranged laterally adjacent to the low-n grid, and wherein the openings individually have a stepped profile and are asymmetric about vertical axes arranged respectively at width-wise centers of the openings.

15. The semiconductor structure according to claim 12, wherein the low-n grid, the hard mask grid, and the substrate isolation grid each comprise a plurality of grid segments, wherein the grid segments of the hard mask grid and the low-n grid laterally enclose respective interior regions intersecting with corresponding ones of the openings, and wherein the grid segments of the substrate isolation grid laterally enclose corresponding ones of the photodiodes.

16. The semiconductor structure according to claim 12, wherein a bottom surface of the low-n grid is arranged over and contacts the top surface of the substrate isolation grid.

17. The semiconductor structure according to claim 12, wherein a bottom surface of the low-n grid is arranged over the top surface of the substrate isolation grid, and wherein width-wise centers of the openings are laterally offset from width-wise centers of respective ones of the photodiodes.

18. An image sensor comprising:
a plurality of photodiodes arranged within a semiconductor substrate;
a metal grid overlying the semiconductor substrate and comprising a plurality of metal grid segments that laterally enclose a plurality of first openings, respectively, wherein the first openings overly the photodiodes, respectively;
a dielectric grid overlying the semiconductor substrate and adjoining the metal grid, wherein the dielectric grid comprises a plurality of dielectric grid segments that laterally enclose a plurality of second openings, respectively, and wherein the second openings overly the photodiodes, respectively; and
an isolation grid arranged over the semiconductor substrate and arranged under the dielectric grid, wherein the isolation grid extends into the semiconductor substrate and comprises a plurality of isolation grid segments that laterally enclose the photodiodes, respectively.

19. The image sensor according to claim 18, wherein the metal grid is spaced over the isolation grid.

20. The image sensor according to claim 18, wherein the isolation grid and the metal grid are integrated together.

* * * * *